(12) United States Patent
Hussell et al.

(10) Patent No.: US 12,294,042 B2
(45) Date of Patent: May 6, 2025

(54) LIGHT EMITTING DIODES AND METHODS WITH ENCAPSULATION

(71) Applicant: CreeLED, Inc., Durham, NC (US)

(72) Inventors: Christopher P. Hussell, Cary, NC (US); Zhenyu Zhong, TKO (HK)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 15/087,641

(22) Filed: Mar. 31, 2016

(65) Prior Publication Data

US 2016/0293811 A1 Oct. 6, 2016

Related U.S. Application Data

(60) Provisional application No. 62/141,065, filed on Mar. 31, 2015.

(51) Int. Cl.
*H01L 33/48* (2010.01)
*H01L 25/00* (2006.01)
(Continued)

(52) U.S. Cl.
CPC .......... *H01L 33/52* (2013.01); *H01L 25/0753* (2013.01); *H01L 27/156* (2013.01);
(Continued)

(58) Field of Classification Search
CPC .................. H01L 25/0753; H01L 33/56; H01L 2224/16225; H01L 33/58; H01L 2933/005;
(Continued)

(56) References Cited

U.S. PATENT DOCUMENTS 1,014,179 A 1/1912 Roney
4,473,277 A * 9/1984 Brown .................. H01J 29/896
359/488.01

(Continued)

FOREIGN PATENT DOCUMENTS

CA 2 936 473 A1 1/2018
CN 201340702 Y 11/2009
(Continued)

OTHER PUBLICATIONS

Restriction Requirement for U.S. Appl. No. 15/654,323 dated Dec. 28, 2017.
(Continued)

*Primary Examiner* — Mary A Wilczewski
*Assistant Examiner* — Tsz K Chiu
(74) *Attorney, Agent, or Firm* — Withrow & Terranova, P.L.L.C.

(57) ABSTRACT

Solid state lighting apparatuses, systems, and related methods are provided. An example apparatus can include one or more light emitting diodes (LEDs) and a dark or black encapsulation layer surrounding and/or disposed between the one or more LEDs. The apparatus can include, e.g., a substrate or a leadframe for mounting the LEDs. A method for producing a panel of LEDs can include joining the LEDs to the panel, e.g., by bump bonding, and flooding the panel with dark or black encapsulation material so that the LED chips are surrounded by the dark or black encapsulation material.

28 Claims, 16 Drawing Sheets

(51) Int. Cl.
*H01L 25/075* (2006.01)
*H01L 27/15* (2006.01)
*H01L 33/22* (2010.01)
*H01L 33/52* (2010.01)
*H01L 33/60* (2010.01)
*H01L 33/62* (2010.01)
*H01L 33/56* (2010.01)
*H01L 33/58* (2010.01)

(52) U.S. Cl.
CPC .............. *H01L 33/22* (2013.01); *H01L 33/60* (2013.01); *H01L 33/62* (2013.01); *H01L 33/56* (2013.01); *H01L 33/58* (2013.01); *H01L 2224/16225* (2013.01); *H01L 2924/181* (2013.01); *H01L 2933/005* (2013.01); *H01L 2933/0066* (2013.01)

(58) Field of Classification Search
CPC ... H01L 23/28–3192; H01L 21/56–568; H01L 2924/181–186
See application file for complete search history.

(56) References Cited

U.S. PATENT DOCUMENTS

| | | | |
|---|---|---|---|
| 4,918,497 | A | 4/1990 | Edmond |
| 4,946,547 | A | 8/1990 | Palmour et al. |
| 4,966,862 | A | 10/1990 | Edmond |
| 5,027,168 | A | 6/1991 | Edmond |
| 5,200,022 | A | 4/1993 | Kong et al. |
| 5,210,051 | A | 5/1993 | Carter, Jr. |
| 5,338,944 | A | 8/1994 | Edmond et al. |
| 5,359,345 | A | 10/1994 | Hunter |
| 5,382,811 | A * | 1/1995 | Takahashi .................. G09F 9/33 313/500 |
| RE34,861 | E | 2/1995 | Davis et al. |
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond et al. |
| 5,912,477 | A | 6/1999 | Negley |
| 6,120,600 | A | 9/2000 | Edmond et al. |
| 6,187,606 | B1 | 2/2001 | Edmond et al. |
| 6,195,882 | B1 * | 3/2001 | Tsukamoto .......... H05K 3/4069 29/852 |
| 6,201,262 | B1 | 3/2001 | Edmond et al. |
| 6,600,175 | B1 | 7/2003 | Baretz et al. |
| 6,791,119 | B2 | 9/2004 | Slater et al. |
| 6,853,010 | B2 | 2/2005 | Slater et al. |
| 6,958,497 | B2 | 10/2005 | Emerson et al. |
| 7,095,056 | B2 | 8/2006 | Vitta et al. |
| 7,128,442 | B2 * | 10/2006 | Lee ......................... F21V 29/89 362/570 |
| 7,213,940 | B1 | 5/2007 | van De Ven et al. |
| 7,244,965 | B2 * | 7/2007 | Andrews ................ H01L 33/58 257/E33.056 |
| 7,256,486 | B2 | 8/2007 | Lee et al. |
| 7,279,355 | B2 | 10/2007 | Lee et al. |
| 7,382,976 | B1 | 6/2008 | Mok et al. |
| 7,445,354 | B2 | 11/2008 | Aoki et al. |
| 7,456,035 | B2 | 11/2008 | Eliashevich et al. |
| 7,456,499 | B2 | 11/2008 | Loh et al. |
| 7,564,180 | B2 | 7/2009 | Brandes |
| 7,655,957 | B2 | 2/2010 | Loh et al. |
| 7,678,595 | B2 | 3/2010 | Chang |
| 7,791,061 | B2 | 9/2010 | Edmond et al. |
| 7,802,901 | B2 | 9/2010 | McMillan |
| 7,821,023 | B2 | 10/2010 | Yuan et al. |
| 7,919,787 | B2 | 4/2011 | Lee et al. |
| 7,952,544 | B2 | 5/2011 | Roberts |
| 7,960,819 | B2 | 6/2011 | Loh et al. |
| 7,999,283 | B2 | 8/2011 | Chakraborty et al. |
| 8,018,135 | B2 | 9/2011 | Van De Ven et al. |
| 8,044,418 | B2 | 10/2011 | Loh et al. |
| 8,058,088 | B2 | 11/2011 | Cannon et al. |
| 8,125,137 | B2 | 2/2012 | Medendorp, Jr. et al. |
| 8,264,138 | B2 | 9/2012 | Negley et al. |
| 8,337,071 | B2 | 12/2012 | Negley et al. |
| 8,373,182 | B2 | 2/2013 | Seko et al. |
| 8,563,339 | B2 | 10/2013 | Tarsa et al. |
| 8,729,589 | B2 | 5/2014 | Hussell et al. |
| 8,735,928 | B2 * | 5/2014 | Jager ...................... H01L 33/60 257/98 |
| 8,866,410 | B2 | 10/2014 | Negley et al. |
| 8,940,561 | B2 | 1/2015 | Donofrio et al. |
| 8,970,131 | B2 | 3/2015 | Brandes et al. |
| 8,981,415 | B1 | 3/2015 | Hsu et al. |
| 9,024,349 | B2 | 5/2015 | Chitnis et al. |
| 9,054,257 | B2 | 6/2015 | Chan et al. |
| 9,131,561 | B2 | 9/2015 | Athalye |
| 9,159,888 | B2 | 10/2015 | Chitnis et al. |
| 9,277,605 | B2 | 3/2016 | Ni |
| 9,406,852 | B2 * | 8/2016 | Nakabayashi ........ H01L 33/502 |
| 9,414,454 | B2 * | 8/2016 | Brandes ............... H05B 33/086 |
| 9,607,958 | B2 * | 3/2017 | Lin .................. H01L 23/49816 |
| 9,680,071 | B2 * | 6/2017 | Nakabayashi .......... H01L 33/56 |
| 9,682,886 | B1 * | 6/2017 | Almanza-Workman ..................... B43K 8/02 |
| 9,713,211 | B2 | 7/2017 | van de Ven et al. |
| 9,735,198 | B2 | 8/2017 | Joo et al. |
| 9,887,329 | B2 | 2/2018 | Yamada |
| 9,966,370 | B2 * | 5/2018 | Moosburger ........... H01L 33/60 |
| 10,043,960 | B2 | 8/2018 | Andrews et al. |
| 10,312,285 | B2 | 6/2019 | Mizuta |
| 10,325,962 | B2 | 6/2019 | Kim et al. |
| 10,388,838 | B2 | 8/2019 | Hung et al. |
| 10,453,827 | B1 | 10/2019 | Hussell et al. |
| 10,910,523 | B2 | 2/2021 | Hung et al. |
| 11,171,123 | B2 * | 11/2021 | Tangring ................ H01L 33/60 |
| 11,245,057 | B2 * | 2/2022 | Maeda ............... H01L 33/0095 |
| 11,322,662 | B2 * | 5/2022 | Brandl ................. H01L 33/504 |
| 11,508,887 | B2 | 11/2022 | Chen et al. |
| 11,870,022 | B2 | 1/2024 | Chen et al. |
| 2001/0032985 | A1 | 10/2001 | Bhat et al. |
| 2002/0131151 | A1 * | 9/2002 | Engler ................. G02B 26/026 359/296 |
| 2003/0143423 | A1 | 7/2003 | McCormick et al. |
| 2003/0146695 | A1 * | 8/2003 | Seki ..................... H01L 51/5284 313/506 |
| 2003/0151361 | A1 | 8/2003 | Ishizaka |
| 2004/0062040 | A1 * | 4/2004 | Blume ................... G02B 27/01 362/231 |
| 2004/0069993 | A1 | 4/2004 | Murano |
| 2005/0023550 | A1 | 2/2005 | Eliashevich et al. |
| 2005/0035356 | A1 | 2/2005 | Kek et al. |
| 2005/0045897 | A1 | 3/2005 | Chou et al. |
| 2005/0184387 | A1 | 8/2005 | Collins, III et al. |
| 2005/0212447 | A1 | 9/2005 | Oh et al. |
| 2006/0006404 | A1 * | 1/2006 | Ibbetson ............... H01L 33/486 438/22 |
| 2006/0018608 | A1 | 1/2006 | Mizoguchi |
| 2006/0060870 | A1 | 3/2006 | Park et al. |
| 2006/0118807 | A1 * | 6/2006 | Ives ....................... H01L 25/167 257/99 |
| 2006/0145172 | A1 | 7/2006 | Su et al. |
| 2006/0152668 | A1 * | 7/2006 | Jang ....................... G02F 1/1339 349/156 |
| 2006/0157722 | A1 | 7/2006 | Takezawa et al. |
| 2006/0193121 | A1 | 8/2006 | Kamoshita |
| 2006/0198162 | A1 | 9/2006 | Ishidu et al. |
| 2006/0221272 | A1 | 10/2006 | Negley et al. |
| 2006/0261364 | A1 | 11/2006 | Suehiro et al. |
| 2007/0085944 | A1 * | 4/2007 | Tanaka ............. G02F 1/133603 349/69 |
| 2007/0104828 | A1 | 5/2007 | Fornaguera |
| 2007/0161211 | A1 | 7/2007 | Sunohara et al. |
| 2007/0178629 | A1 | 8/2007 | Ogawa et al. |
| 2007/0228387 | A1 | 10/2007 | Negley et al. |
| 2007/0262323 | A1 * | 11/2007 | Sonobe ................... F21V 3/061 257/77 |

(56) References Cited

U.S. PATENT DOCUMENTS

| | | | |
|---|---|---|---|
| 2007/0262339 A1* | 11/2007 | Hussell | C09K 11/7731 |
| | | | 257/E33.059 |
| 2007/0268694 A1 | 11/2007 | Bailey et al. | |
| 2008/0048200 A1 | 2/2008 | Mueller et al. | |
| 2008/0179611 A1* | 7/2008 | Chitnis | H01L 33/508 |
| | | | 257/98 |
| 2008/0218072 A1 | 9/2008 | Haruna et al. | |
| 2008/0224608 A1 | 9/2008 | Konishi et al. | |
| 2008/0233666 A1 | 9/2008 | Park et al. | |
| 2008/0258130 A1 | 10/2008 | Bergmann et al. | |
| 2008/0258156 A1* | 10/2008 | Hata | H01L 33/20 |
| | | | 257/88 |
| 2008/0284307 A1* | 11/2008 | Kuo | G09G 3/22 |
| | | | 313/495 |
| 2008/0298063 A1* | 12/2008 | Hayashi | H01L 25/0753 |
| | | | 362/249.01 |
| 2009/0050908 A1 | 2/2009 | Yuan et al. | |
| 2009/0057690 A1 | 3/2009 | Chakraborty | |
| 2009/0079328 A1 | 3/2009 | Fedorovskaya et al. | |
| 2009/0108281 A1 | 4/2009 | Keller et al. | |
| 2009/0115313 A1 | 5/2009 | Lu et al. | |
| 2009/0127702 A1 | 5/2009 | Dekker et al. | |
| 2009/0146176 A1 | 6/2009 | Oishi | |
| 2009/0173956 A1* | 7/2009 | Aldaz | H01L 33/405 |
| | | | 257/E33.072 |
| 2009/0230409 A1 | 9/2009 | Basin et al. | |
| 2010/0060553 A1* | 3/2010 | Zimmerman | H01L 25/0753 |
| | | | 345/60 |
| 2010/0140655 A1 | 6/2010 | Shi | |
| 2010/0155763 A1 | 6/2010 | Donofrio et al. | |
| 2010/0200898 A1* | 8/2010 | Lin | H01L 31/0203 |
| | | | 257/E31.11 |
| 2010/0237375 A1 | 9/2010 | Yamazaki et al. | |
| 2010/0246152 A1 | 9/2010 | Lin et al. | |
| 2010/0252851 A1 | 10/2010 | Emerson et al. | |
| 2010/0258830 A1 | 10/2010 | Ide et al. | |
| 2011/0006334 A1 | 1/2011 | Ishii et al. | |
| 2011/0031524 A1 | 2/2011 | Pei | |
| 2011/0068702 A1 | 3/2011 | van De Ven et al. | |
| 2011/0079801 A1 | 4/2011 | Zhang et al. | |
| 2011/0140148 A1 | 6/2011 | Liu | |
| 2011/0176301 A1 | 7/2011 | Liang et al. | |
| 2011/0291125 A1* | 12/2011 | Donauer | F21V 31/005 |
| | | | 257/88 |
| 2011/0316024 A1 | 12/2011 | Hung et al. | |
| 2012/0056228 A1* | 3/2012 | Horng | H01L 24/32 |
| | | | 257/E33.072 |
| 2012/0112220 A1* | 5/2012 | West | H01L 33/502 |
| | | | 257/E33.072 |
| 2012/0149138 A1* | 6/2012 | Su | H01L 33/641 |
| | | | 257/E33.056 |
| 2012/0153340 A1 | 6/2012 | Song et al. | |
| 2012/0154917 A1 | 6/2012 | Teather | |
| 2012/0193788 A1* | 8/2012 | Fu | H01L 21/4853 |
| | | | 257/737 |
| 2012/0206503 A1* | 8/2012 | Hirakata | H04N 13/359 |
| | | | 345/690 |
| 2012/0235169 A1* | 9/2012 | Seko | H01L 33/60 |
| | | | 257/88 |
| 2012/0248469 A1 | 10/2012 | Choi | |
| 2012/0261689 A1* | 10/2012 | Appelt | H01L 21/4832 |
| | | | 257/E33.059 |
| 2012/0305949 A1* | 12/2012 | Donofrio | H01L 25/0753 |
| | | | 257/E33.066 |
| 2012/0319150 A1 | 12/2012 | Shimomura et al. | |
| 2013/0026520 A1 | 1/2013 | Hu et al. | |
| 2013/0069525 A1 | 3/2013 | Imai | |
| 2013/0069536 A1 | 3/2013 | Ni | |
| 2013/0075902 A1* | 3/2013 | Chow | H01L 21/56 |
| | | | 257/737 |
| 2013/0092966 A1 | 4/2013 | Jaeger et al. | |
| 2013/0093313 A1 | 4/2013 | Oyamada | |
| 2013/0163244 A1 | 6/2013 | Suzuki | |
| 2013/0187178 A1* | 7/2013 | Tischler | H01L 33/486 |
| | | | 257/88 |
| 2013/0207141 A1 | 8/2013 | Reiherzer | |
| 2013/0256711 A1 | 10/2013 | Joo et al. | |
| 2013/0264589 A1 | 10/2013 | Bergmann et al. | |
| 2013/0270592 A1 | 10/2013 | Reiherzer et al. | |
| 2013/0279169 A1 | 10/2013 | Reiherzer et al. | |
| 2013/0307013 A1* | 11/2013 | Chan | H01L 25/0753 |
| | | | 257/99 |
| 2013/0334959 A1 | 12/2013 | Wang et al. | |
| 2014/0042467 A1 | 2/2014 | Livesay et al. | |
| 2014/0070235 A1 | 3/2014 | Andrews et al. | |
| 2014/0077682 A1* | 3/2014 | Ho | H05B 33/02 |
| | | | 313/117 |
| 2014/0091326 A1 | 4/2014 | Tran et al. | |
| 2014/0153238 A1 | 6/2014 | Nishimura et al. | |
| 2014/0232289 A1 | 8/2014 | Brandes et al. | |
| 2014/0239325 A1 | 8/2014 | Andrews et al. | |
| 2014/0239332 A1 | 8/2014 | Iwakura et al. | |
| 2014/0346545 A1 | 11/2014 | Chan et al. | |
| 2014/0362570 A1* | 12/2014 | Miyoshi | F21K 9/68 |
| | | | 362/240 |
| 2014/0367713 A1 | 12/2014 | Zhang et al. | |
| 2015/0021642 A1* | 1/2015 | Nakabayashi | H01L 24/97 |
| | | | 257/98 |
| 2015/0028307 A1 | 1/2015 | Kim et al. | |
| 2015/0049510 A1 | 2/2015 | Haiberger et al. | |
| 2015/0129902 A1* | 5/2015 | Iino | H01L 33/46 |
| | | | 257/98 |
| 2015/0162317 A1 | 6/2015 | Tran et al. | |
| 2015/0194583 A1 | 7/2015 | Sabathil et al. | |
| 2015/0257211 A1 | 9/2015 | Johnson et al. | |
| 2015/0287892 A1 | 10/2015 | Han et al. | |
| 2015/0371585 A1 | 12/2015 | Bower et al. | |
| 2016/0027973 A1 | 1/2016 | Maki | |
| 2016/0043064 A1 | 2/2016 | Tran et al. | |
| 2016/0181476 A1* | 6/2016 | Chang | H01L 33/06 |
| | | | 257/13 |
| 2016/0181491 A1 | 6/2016 | Sabathil et al. | |
| 2016/0293812 A1* | 10/2016 | Pindl | H01L 31/186 |
| 2016/0351539 A1* | 12/2016 | Bower | H01L 25/167 |
| 2017/0005079 A1 | 1/2017 | Hoeppel et al. | |
| 2017/0062681 A1 | 3/2017 | Miyoshi et al. | |
| 2017/0092690 A1 | 3/2017 | Mizuta | |
| 2017/0154880 A1* | 6/2017 | Ozeki | H01L 33/0095 |
| 2017/0345801 A1* | 11/2017 | Lin | H01L 25/075 |
| 2017/0345866 A1 | 11/2017 | Joo et al. | |
| 2017/0358624 A1 | 12/2017 | Takeya et al. | |
| 2018/0006192 A1 | 1/2018 | Rudmann et al. | |
| 2018/0076368 A1 | 3/2018 | Hussell | |
| 2018/0097164 A1* | 4/2018 | Katsumata | H05K 3/0038 |
| 2018/0105669 A1 | 4/2018 | Otsubo | |
| 2018/0195675 A1 | 7/2018 | Miyoshi et al. | |
| 2018/0358405 A1* | 12/2018 | Chaji | H01L 24/92 |
| 2019/0009766 A1 | 1/2019 | Meckenstock et al. | |
| 2019/0051762 A1 | 2/2019 | Yu et al. | |
| 2019/0123213 A1 | 4/2019 | Yu et al. | |
| 2019/0355884 A1* | 11/2019 | Pan | H01L 27/156 |
| 2019/0355886 A9 | 11/2019 | Hussell | |
| 2020/0235084 A1 | 7/2020 | Wu et al. | |

FOREIGN PATENT DOCUMENTS

| | | | | |
|---|---|---|---|---|
| CN | 201355545 Y | 12/2009 | | |
| CN | 201688336 U | 12/2010 | | |
| CN | 104979338 A | 10/2015 | | |
| CN | 103718325 B | 3/2017 | | |
| CN | 107438899 A | 12/2017 | | |
| CN | 107438899 B | 4/2021 | | |
| DE | 102013112549 A1 * | 5/2015 | ......... | H01L 31/0203 |
| EP | 2211394 A2 | 7/2010 | | |
| EP | 2472578 A2 | 7/2012 | | |
| EP | 2693854 A2 | 2/2014 | | |
| EP | 2811517 A1 | 12/2014 | | |
| EP | 3 364 458 A1 | 8/2018 | | |
| JP | H10247748 A | 9/1998 | | |
| JP | 2000022218 A | 1/2000 | | |
| JP | 2001160630 A | 6/2001 | | |

(56) References Cited

FOREIGN PATENT DOCUMENTS

| | | | |
|---|---|---|---|
| JP | 2002033517 A | 1/2002 |
| JP | 2006093435 A | 4/2006 |
| JP | 2007189006 A | 7/2007 |
| JP | 2010157638 A | 7/2010 |
| KR | 20080030811 A | 4/2008 |
| KR | 100933920 B1 | 12/2009 |
| KR | 20100008509 A | 1/2010 |
| KR | 20110111941 A | 10/2011 |
| TW | 201 214 795 A | 4/2012 |
| WO | 2009069671 A1 | 6/2009 |
| WO | WO 2016/161161 | 10/2016 |
| WO | WO 2019/231843 A1 | 12/2019 |

OTHER PUBLICATIONS

Notice of Publication for Application No. PCT/US2016/025346 dated Oct. 6, 2016.
International Search Report for Application No. PCT/US2016/025346 dated Aug. 2, 2016.
International Search Report and Written Opinion for Application No. PCT/US2016/025346 dated Aug. 2, 2016.
Notice of Publication for U.S. Appl. No. 15/676,965 dated Mar. 15, 2018.
Restriction Requirement for U.S. Appl. No. 15/676,965 dated Sep. 7, 2018.
Non-Final Office Action for U.S. Appl. No. 15/676,965 dated Nov. 30, 2018.
Non-Final Office Action for U.S. Appl. No. 15/993,540 dated Feb. 21, 2019.
First Search for Chinese Application No. 201680019859.4 dated May 17, 2019; retrieved from Global Dossier on May 31, 2019.
Non-Final Office Action for U.S. Appl. No. 15/676,965 dated Aug. 26, 2019.
Final Office Action for U.S. Appl. No. 15/676,965 dated Feb. 24, 2020.
Chinese Office Action for Application No. 201680019859.4 dated May 27, 2019.
Notice of Allowance for U.S. Appl. No. 15/993,540 dated Jun. 13, 2019.
International Search Report and Written Opinion for Application No. PCT/US2019/033914 dated Sep. 5, 2019.
Chinese Supplementary Search for Application No. 201680019859.4 dated Jan. 5, 2021.
Final Office Action for U.S. Appl. No. 15/676,965 dated Jan. 25, 2021.
Non-Final Office Action for U.S. Appl. No. 15/676,965 dated Jul. 30, 2021.
Non-Final Office Action for U.S. Appl. No. 15/676,965 dated Jul. 30, 2020.
Non-Final Office Action for U.S. Appl. No. 15/654,323, mailed May 8, 2018.
Final Office Action for U.S. Appl. No. 15/654,323, mailed Mar. 1, 2019, 9 pages.
Non-Final Office Action for U.S. Appl. No. 15/654,323, mailed Jul. 23, 2019, 9 pages.
Final Office Action for U.S. Appl. No. 15/654,323, mailed Nov. 21, 2019, 10 pages.
Notice of Allowance for U.S. Appl. No. 15/654,323, mailed Jan. 31, 2020, 8 pages.
Advisory Action for U.S. Appl. No. 15/676,965, mailed Oct. 28, 2022, 3 pages.
Non-Final Office Action for U.S. Appl. No. 15/676,965, mailed Dec. 20, 2022, 7 pages.
Final Office Action for U.S. Appl. No. 15/676,965, mailed Aug. 19, 2022, 8 pages.
Final Office Action for U.S. Appl. No. 15/676,965, mailed Jun. 9, 2023, 8 pages.
Advisory Action for U.S. Appl. No. 15/676,965, mailed Aug. 4, 2023, 3 pages.
Non-Final Office Action for U.S. Appl. No. 15/676,965, mailed Nov. 20, 2023, 8 pages.
First Office Action for Chinese Patent Application No. 202110389262.1, mailed Sep. 21, 2023, 22 pages.
Second Office Action for Chinese Patent Application No. 202110389262.1, mailed Apr. 1, 2024, 13 pages.
Advisory Action for U.S. Appl. No. 15/676,965, mailed Jun. 28, 2024, 3 pages.
Final Office Action for U.S. Appl. No. 15/676,965, mailed Apr. 29, 2024, 8 pages.
Notification to Grant for Chinese Patent Application No. 202110389262.1, mailed Jul. 12, 2024, 8 pages.
Non-Final Office Action for U.S. Appl. No. 15/676,965, mailed Sep. 18, 2024, 9 pages.
Non-Final Office Action for U.S. Appl. No. 15/676,965, mailed Feb. 4, 2022, 13 pages.
Chinese Office Action for Application No. 201680019859 dated May 6, 2020.
Advisory Action for U.S. Appl. No. 15/676,965 dated May 8, 2020.

\* cited by examiner

LIGHT EMITTING DIODES AND METHODS WITH ENCAPSULATION

TECHNICAL FIELD

The present subject matter relates generally to lighting apparatuses and related methods and, more particularly, to solid state lighting apparatuses and related methods.

BACKGROUND

In recent years, there have been dramatic improvements in light emitting diode (LED) technology such that LEDs of increased luminance and color fidelity have been introduced. Due to these improved LEDs and improved image processing technology, large format, full color LED video screens have become available and are now in common use. LED displays typically comprise a combination of individual LED panels providing image resolution determined by the distance between adjacent pixels or "pixel pitch".

Displays that are intended for viewing from great distances, such as for example outdoor displays, have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens, which require smaller pixel pitches such as 3 mm or less, typically comprise panels carrying red, green, and blue LEDs mounted on a single electronic device attached to a printed circuit board (PCB) that controls the output of each electronic device.

Some conventional LED packages have transparent encapsulant covering LED chips to protect the LED chip assembly and so that light emitted from LED packages can be used efficiently. Those skilled in the art routinely engineer package components to be light transparent and not to absorb any light generated by the LED or irradiating the package from external sources. When used in LED displays, however, the transparent encapsulant and other elements of the housing such as metal traces and structural elements in conventional LED packages can reflect too much ambient light. When viewing displays including conventional LED packages, customers experience lower contrast and have difficulty viewing the displayed content if the display reflects too much ambient background light. For example, a customer may find it difficult to read displayed text in daylight conditions if the reflection from the sun is not minimalized. Minimalizing the reflection of the LED source is useful in other lighting applications, as well. For spot lights and other fixtures using lenses, it is helpful to make the source site appear smaller, limiting the reflection around the chip(s).

SUMMARY

Solid state lighting apparatuses, systems, and related methods are provided. An example apparatus can comprise, for example: a substrate; a plurality of electrically conductive traces disposed over the substrate; one or more light emitting diodes (LEDs) each electrically connected to at least two of the electrically conductive traces; and a dark or black encapsulation layer surrounding the one or more LEDs. Other aspects, features and embodiments of the subject matter will be more fully apparent from the ensuing disclosure and appended claims.

BRIEF DESCRIPTION OF DRAWINGS

A full and enabling disclosure of the present subject matter is set forth more particularly in the remainder of the specification, including reference to the accompanying figures, relating to one or more embodiments, in which.

DETAILED DESCRIPTION

Figure 1A:
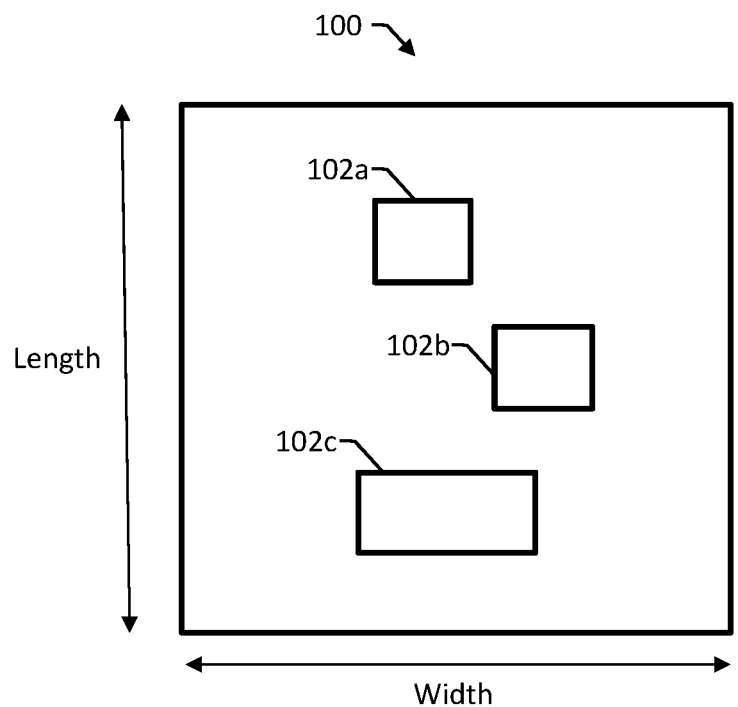
FIGS. 1A through 1O are various illustrations of an example solid state lighting apparatus.

In some aspects, solid state lighting apparatuses and methods described herein can comprise various solid state light emitter electrical configurations, color combinations, and/or circuitry components for providing solid state lighting apparatuses having improved efficiency, improved color mixing, and/or improved color rendering. Apparatuses and methods such as those disclosed herein advantageously cost less, are more efficient, vivid, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising," "including," and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LED chips are electrically connected, such as in series, in parallel, in mixed series/parallel, in common anode, or in common anode configurations among mutually exclusive groups/segments/sets. The segments of LED chips can be configured in a number of different ways and may have circuits of varying functionality associated therewith (e.g. driver circuits, rectifying circuits, current limiting circuits, shunts, bypass circuits, etc.), as discussed, for example, in U.S. patent application Ser. No. 12/566,195, filed on Sep. 24, 2009, now U.S. Pat. No. 8,713,211, U.S. patent application Ser. No. 13/769,273, filed on Feb. 15, 2013, now U.S. Pat. No. 8,970,131, U.S. patent application Ser. No. 13/769,277 filed on Feb. 15, 2013, now U.S. Pat. No. 9,414,454, U.S. patent application Ser. No. 13/235,103, filed on Sep. 16, 2011, now U.S. Pat. No. 9,131,561, U.S. patent application Ser. No. 13/235,127, filed on Sep. 16, 2011, now U.S. Pat. Nos. 9,277,605, and 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LED chips) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards PCBs and/or related components (e.g., including but not limited to metal core printed circuit boards (MCPCBs), flexible circuit boards, dielectric laminates, ceramic based substrates, and the like, or ceramic boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some aspects, a single, unitary substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

Solid state lighting apparatuses according to aspects of the subject matter herein can comprise III-V nitride (e.g., gallium nitride) based LED chips or laser chips fabricated on a silicon, silicon carbide, sapphire, or III-V nitride growth substrate, including (for example) chips manufactured and sold by Cree, Inc. of Durham, N.C. Such LED chips and/or lasers can be configured to operate such that light emission occurs through the substrate in a so-called "flip chip" orientation. Such LED and/or laser chips can also be devoid of growth substrates (e.g., following growth substrate removal). In some cases, LED chips can comprise red-III-V chips, but not nitride such as InGaAlP, GaAsP, and the like.

LED chips useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LED chips having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LED chips of different colors, one or more of which can be white emitting (e.g., including at least one LED chip with one or more lumiphoric materials).

In some aspects, one or more short wavelength solid state emitters (e.g., blue and/or cyan LED chips) can be used to stimulate emissions from a mixture of lumiphoric materials, or discrete layers of lumiphoric material, including red, yellow, and green lumiphoric materials. LED chips of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety, are well-known and available to persons of skill in the art. Utilizing multiple layers of phosphor with LED chips is discussed by way of example in U.S. patent application Ser. No. 14/453,482, filed Aug. 6, 2014, now U.S. Pat. No. 11,251,164, the disclosure of which is hereby incorporated by reference herein in the entirety.

In some aspects, lighting apparatuses and systems as described herein comprise multiple sets of solid state light emitters targeting different colors (e.g., one set targeting a first color and at least a second set targeting a second color that is different than the first color. In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selective activating sets of solid state emitters according to the present subject matter may be provided using the circuitry and/or techniques described in U.S. patent application Ser. No. 14/221,839, and published as U.S. Patent Application Publication No. 2015/0257211 A1, the disclosure of which is incorporated herein by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/566,440, filed on Dec. 4, 2006, now U.S. Pat. No. 7,213,940; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Various illustrative features are described below in connection with the accompanying figures.

FIGS. 1A to 1I are various illustrations of an example solid state lighting apparatus 100. Apparatus 100 is illustrated as being mounted on a substrate with conductive traces, but in some examples, apparatus 100 could be based on a leadframe construction where no traces are on top, or any other appropriate construction.

FIG. 1A is a top view of an example solid state lighting apparatus 100. Apparatus 100 includes three LEDs 102a-c. LEDs 102a-c can each have a different targeted color. Although three LEDs are illustrated, apparatus 100 may include a different number of LEDs, e.g., one or more LEDs. For example, apparatus 100 can be a 2×2 component with four red LEDs, four blue LEDs, and four green LEDs.

In some examples, LEDs 102a-c have different targeted colors selected so that apparatus 100 can operate as a pixel and produce a range of colors within its color gamut by energizing different combinations of LEDs 102a-c. For example, one or more of LEDs 102a-c may include: a UV, blue or green LED chip, such as a group III nitride based LED chip comprising negatively doped (n-type) epitaxial layer(s) of gallium nitride or its alloys and positively doped (p-type) epitaxial layers of gallium nitride or its alloys surrounding a light emitting active region; a red LED chip, such as an AlInGaP based red LED chip; a white LED chip (e.g., blue LED chip with phosphor(s) layer(s)), and/or a non-white phosphor based LED chip.

Figure 1B:
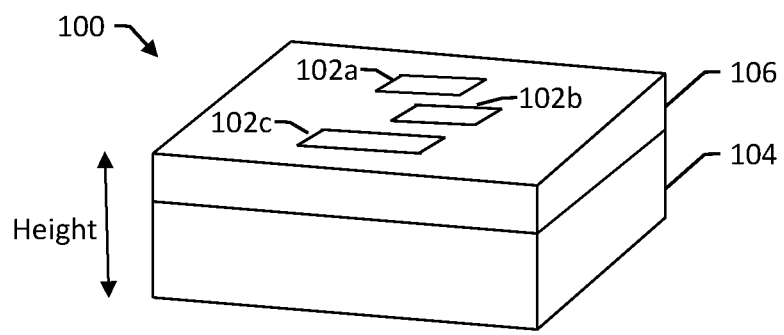

FIG. 1B is a perspective view of apparatus 100. Apparatus 100 can include a substrate 104, which may support one or more electrical circuitry components for driving LEDs. LEDs 102a-c can be mounted on the substrate 104 and then encapsulated in an encapsulation layer 106. The encapsulation layer 106 can be formed from, e.g., a substantially dark, such as black for example, material, which can be useful, e.g., for improving the contrast of apparatus 100 when used in an array of solid state lighting apparatuses.

In some examples, the LEDs 102a-c are attached to a sub-structure first, and then an encapsulant can be applied to create the encapsulation layer 106. The encapsulation layer 106 can surround the LEDs 102a-c, e.g., surround the LEDs 102a-c on four or more sides of the LEDs 102a-c. As illustrated, the encapsulation layer 106 can surround the LEDs 102a-c on all, such as four, sides, e.g., in a horizontal plane. The encapsulation layer 106 can also be disposed between the LEDs 102a-c or disposed so as to be both between the LEDs 102a-c and surrounding the LEDs 102a-c. As illustrated, for example and without limitation, the encapsulation layer 106 is shown surrounding and between the LEDs 102a-c. In some aspects, the encapsulant or encapsulation layer can be applied, such as by dispensing or by any other suitable technique, to or around one or more light emitting diode (LED) such as the LEDs 102a-c. After application of the encapsulant, the encapsulant can be planarized to expose or nearly or almost expose the one or more light emitting diode (LED). The planarizing of the encapsulant can be performed such that a top surface of the one or more light emitting diode (LED) is completely or fully exposed, or such that the top surface of the one or more light emitting diode (LED) such as the LEDs 102a-c is substantially exposed so that the top surface is exposed to within 25 µm or less of being fully exposed.

The encapsulation layer 106 can be in contact with the LEDs 102a-c or near to the LEDs 102a-c. The encapsulation layer 106 is considered near to the LEDs 102a-c if the encapsulation layer 106 is at or less than a threshold distance from the LEDs 102a-c. The threshold distance can, for example and without limitation, be 200 µm or less, 150 µm or less, 100 µm or less, or 50 µm or less. The threshold distance can be the smallest distance between the LEDs 102a-c and the encapsulation layer, so that some portions of the encapsulation layer 106 can be further from the LEDs 102a-c and the encapsulation layer 106 is still near to the LEDs 102a-c.

In some aspects, a light emitting diode (LED) apparatus can comprise at least one or more light emitting diode (LED), and each of the one or more LED can comprise a light emitting surface. The apparatus can comprise an encapsulation layer including an inner layer or an outer layer substantially coplanar with the LED by at least 25 µm or less. In some aspects, the apparatus can include an LED substrate on or over which the one or more LED can be disposed. In some aspects, the apparatus can comprise the encapsulation layer including an inner layer or an outer layer substantially coplanar with a top side of the LED by at least 25 µm or less. In some aspects, the encapsulation layer can comprise a black encapsulation layer.

As used in this document, the term "dark" or "black" refers to a material having a reflectivity below a threshold and a transmittance below a threshold. For example and without limitation, the material can have a reflectivity below 70% or below 50%, or the material can have a reflectivity below 4%. The material can have a transmittance of 20% per mm of thickness or less and a reflectivity below 70% or below 50%.

Although the encapsulation layer 106 is depicted as being flush with the top of apparatus 100, in some examples, the encapsulation layer 106 may not be flush with the tops of LEDs 102a-c. For example, in some cases, the encapsulation layer 106 could cover LEDs 102a-c, e.g., in a thin layer. In some cases, LEDs 102a-c may stick out from the encapsulation layer 106, e.g., to some small degree. The top of apparatus 100 in some examples may not be flat, e.g., the top can curve up or curve down or be textured, e.g., as a result of grinding, lapping, and/or sandblasting.

Figure 1C:
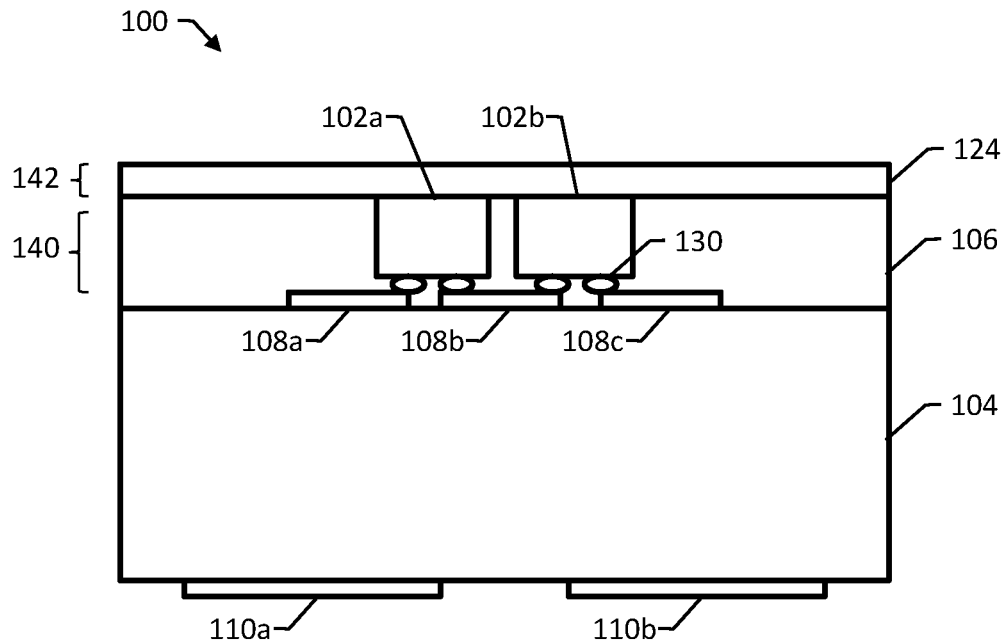

FIG. 1C is a cross-sectional view of apparatus 100. A number of electrical traces 108a-c can be disposed over substrate 104. Traces 108a-c can comprise a mounting area for LEDs, and traces 108a-c may be provided over substrate 104 for passing electrical current to any number of LEDs, which may be customized in number, color, shape, size, and/or chip spacing for providing any desired emissions (e.g., any desired brightness, intensity, and/or color). Apparatus 100 can also include a number of bottom traces 110a-b. Bottom traces 110a-b can be useful for, e.g., integrating apparatus 100 into an array of multiple solid state lighting apparatuses.

Traces 108a-c can comprise any suitable electrically conductive material, e.g., Cu, finished with electroless Ag, Ni—Ag, ENIG, ENIPIG, HASL, OSP, or the like. Traces 108a-c can be applied over one or more surfaces of substrate 104 via plating (e.g., via electroplating or electroless plating), depositing (e.g., physical, chemical, and/or plasma deposition, CVD, PECVD, etc.), sputtering, or via any other suitable technique. In some aspects, traces 108a-c can comprise a metal or metal alloy which may contain (in whole or part) copper (Cu), silver (Ag), gold (Au), titanium (Ti), palladium (Pd), aluminum (Al), tin (Sn), combinations thereof, and/or any other suitable conductor.

In some aspects, substrate 104 can comprise a printed circuit board (PCB), a metal core printed circuit board (MCPCB), a flexible printed circuit board, a dielectric laminate (e.g., FR-4 boards as known in the art), a ceramic based substrate, or any other suitable substrate for mounting LED chips and/or LED packages. In some aspects substrate 104 can comprise one or more materials arranged to provide desired electrical isolation and high thermal conductivity. For example, at least a portion of substrate 104 may comprise a dielectric to provide the desired electrical isolation between electrical traces and/or sets of solid state emitters. In some aspects, substrate 104 can comprise ceramic such as alumina ($Al_2O_3$), aluminum nitride (AlN), silicon carbide (SiC), silicon, or a plastic or polymeric material such as polyimide, polyester etc. In some aspects, substrate 104 comprises a flexible circuit board, which can allow the substrate to take a non-planar or curved shape allowing for providing directional light emission with the solid state emitters also being arranged in a non-planar manner.

In some aspects, LEDs 102a-c can be horizontally structured so that LEDs 102a-c can be electrically connected to traces 108a-b without the use of wire bonding. For example, each of LEDs 102a-c can be a horizontally structured device where each electrical contact (e.g., the anode and cathode) can be disposed on a bottom surface of the LED 102a-c. Apparatus 100 includes die attach material 130, e.g., solder bumps. Die attaching LEDs 102a-c using any suitable material and/or technique (e.g., solder attachment, preform attachment, flux or no-flux eutectic attachment, silicone epoxy attachment, metal epoxy attachment, thermal compression attachment, bump bonding, and/or combinations thereof) can directly electrically connect LEDs 102*a-c* to traces 108*a-b* without requiring wire bonds.

In some aspects, each of LEDs 102*a-c* can be a device that does not comprise angled or beveled surfaces. For example, each of LEDs 102*a-c* can be an LED device that comprises coplanar electrical contacts on one side of the LED (bottom side) with the majority of the light emitting or transmitting surface being located on the opposite side (upper side). In the example of FIG. 1C, LEDs 102*a-b* are bump bonded to traces 108*a-c*, e.g., using bumps of solder (or other appropriate conductive material) and force, energy (e.g., ultrasonic), and/or heat.

In some aspects, apparatus 100 can have a size less than 1.6 mm$^2$ square with reference to the length and width illustrated in FIG. 1A. For example, the dimensions of apparatus 100 can be between 0.8 mm×0.8 mm and 1 mm×1 mm. Apparatus 100 can be made using bump bonding of small die, e.g., less than 0.1 mm$^2$, or between 0.01 mm$^2$ per die and 0.03 mm$^2$ per die or 0.05 mm$^2$ per die. Apparatus 100 can have a thickness of 1.0 mm or less with reference to the height illustrated in FIG. 1B. For example, apparatus 100 can have a height of 0.8 mm or 0.5 mm. The LEDs 102 can have a length or a width less than 0.3 mm, e.g., so that apparatus 100 is 0.1 mm by 0.195 mm, or 0.13 mm by 0.21, or 0.18 mm by 0.255 mm.

FIG. 1C also illustrates one or more optional layer or layers 124 on top of LEDs 102*a-b*. For example, optional layers 124 can include diffuse layers for optics, lenses, polarizers, anti-reflective (AR) coating, anti glare, micro lenses, light steering, parallax barrier, lenticular arrays, and so on. Phosphor or other light converting elements can be added to some or all of optional layers 124. In some examples, the height 140 of the LED chips can be about 10 µm. The height 142 of optional layers 124 can be about or less than 50 µm, so that the substrates of the LED chips are less than 50 µm from the top of apparatus 100. As a result, the diffuse reflection of apparatus 100 can be 5% or less in the visible part of the spectrum. Layer 124 can comprise a diffuse top layer over the LEDs or the dark or black encapsulation layer or both, resulting in a matte finish or a modified light emission pattern.

Figure 1D:
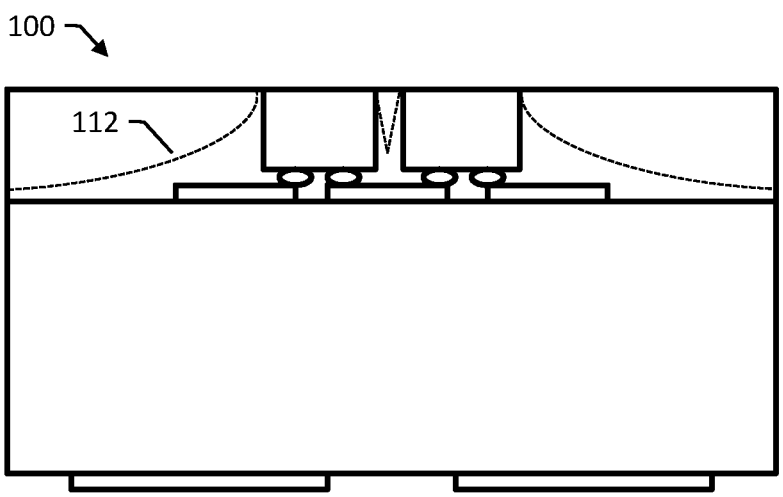

FIG. 1D illustrates apparatus 100 with an optional layer 112 of reflective coating, which can be referred to as a reflective element or elements on or at the sides of the LEDs 102*a-b*. Layer or layers 112 taper from the sides of apparatus 100 towards the LEDs 102*a-b* and between the LEDs 102*a-b*. The reflective coating can be, e.g., silicone or epoxy filled with titania or titanium dioxide white material that can be wetted underneath and on the sides of the chip. In some examples, the reflective coating can be grey, e.g., having a reflectivity between 20 and 80%. The shade of grey can be selected to tune balance and contrast. Greater reflectivity results in brighter light from apparatus 100, but will generally decrease contrast. FIG. 1J illustrates apparatus 100 with optional layer 112 of reflective coating having a different profile than that illustrated in FIG. 1D. In FIG. 1J, optional layer 112 turns up sharply close to the LEDs 102*a-b* and fills in the space between the LEDs 102*a-b* completely, so that optional layer 112 is flush with the tops of LEDs 102*a-b*.

Figure 1E:
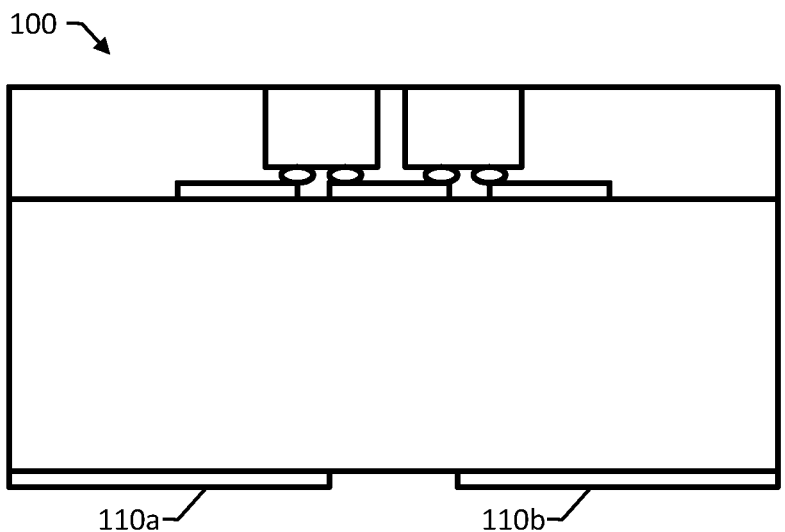

FIG. 1E illustrates apparatus 100 with optional bottom traces 110*a-b* that extend all the way to the edges. Gaps between the bottom traces 110*a-b* and the edges can use a lot of real estate on apparatus 100, so extending bottom traces 110*a-b* can improve space usage on the bottom side of apparatus 100, e.g., to improve mounting of apparatus 100. For example, bottom traces 110*a-b* can have an area of 45% or greater of the substrate area of apparatus 100.

Figure 1F:
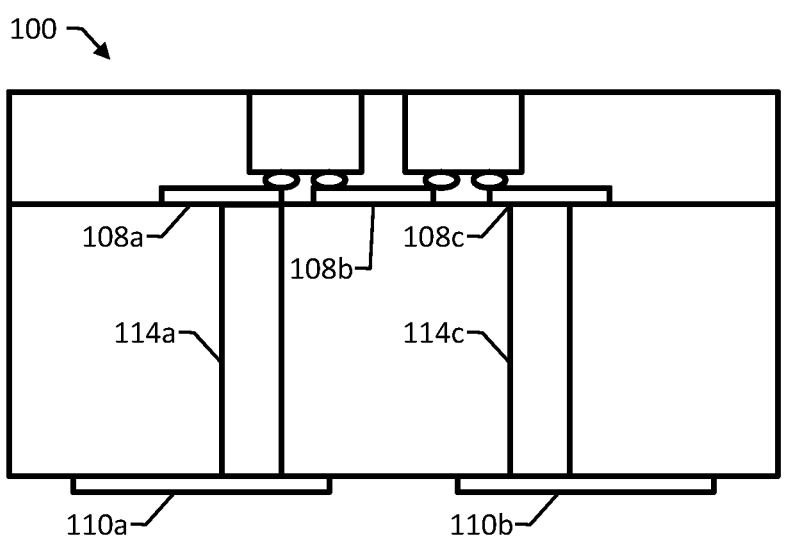

FIG. 1F illustrates apparatus 100 with optional conductive vias 114*a* and 114*c* that extend through the substrate 112. For example, vias 114*a* and 114*c* can extend from top traces 108*a* and 108*c* to bottom traces 110*a* and 110*b*. In some examples, vias can be on an edge of substrate 104. By placing vias on an edge of substrate 104, vias can be shared between devices and cut in half or in quarters during singulation.

In some examples, vias are hollow, and it can be useful to prevent encapsulant from leaking from the top of apparatus 100 to the bottom side by flowing through the via. When LEDs 102*a-c* are bonded over the vias so that the electrically conductive bump bond material seals the vias, the bump bond material can prevent the encapsulant from flowing through the via. This can be useful, e.g., to save costs associated with filling the vias.

Figure 1G:
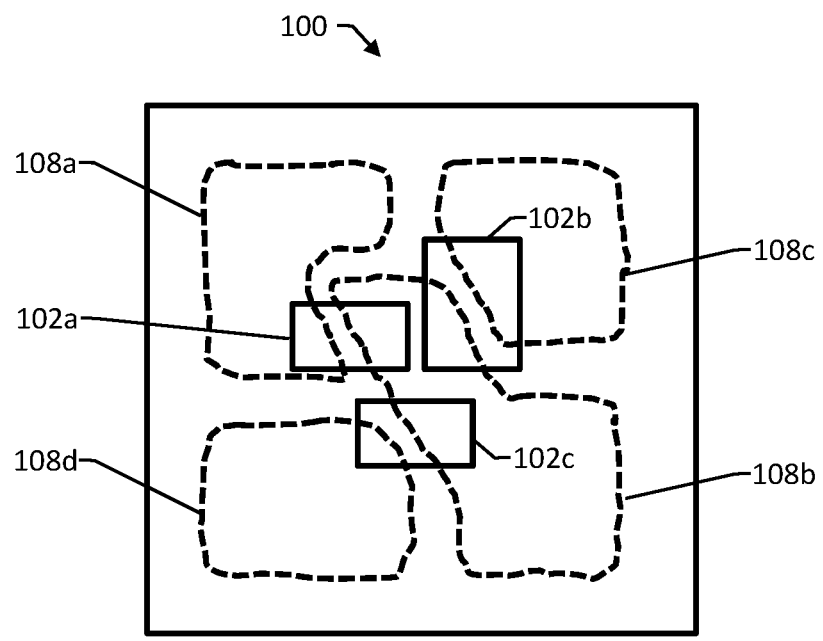

FIG. 1G is a top view of apparatus 100 illustrating example electrical connections between LEDs 102*a-c* and traces 108*a-d*. Trace 108*b* can be, e.g., a common electrical node for connection to anodes of LEDs 102*a-c*. Traces 108*a*, 108*c*, and 108*d* can be electrically coupled to the cathodes of LEDs 102*a-c* so that each LED can be individually controlled.

Figure 1H:
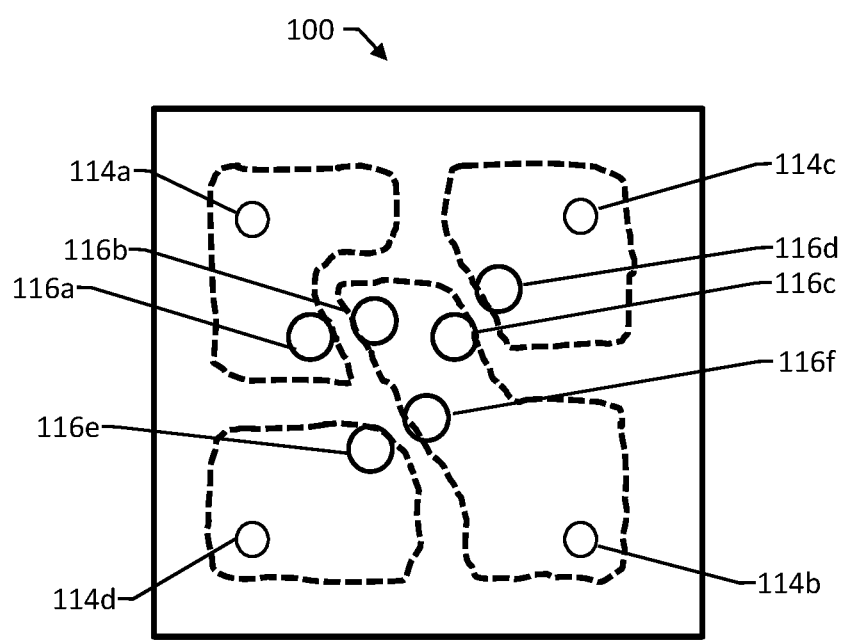

FIG. 1H is a top view of apparatus 100 illustrating example conductive vias 114*a-d* and openings 116*a-f* in solder mask layer. Vias 114*a-d* can be configured to electrically couple traces 108*a-d* to traces on the bottom of the substrate 112 or traces within the substrate or elsewhere. Openings 116*a-f* permit conductive material to be applied to traces 108*a-d* so that, when LEDs 102*a-c* are mounted, LEDs 102*a-c* become electrically coupled as illustrated in FIG. 1G. In some examples, the solder mask can be dark or black (higher contrast), and sidewalls of LEDs 102*a-c* can be made white (increased brightness with less impact on contrast). The white sidewalls may also help broaden the viewing angle.

Figure 1I:
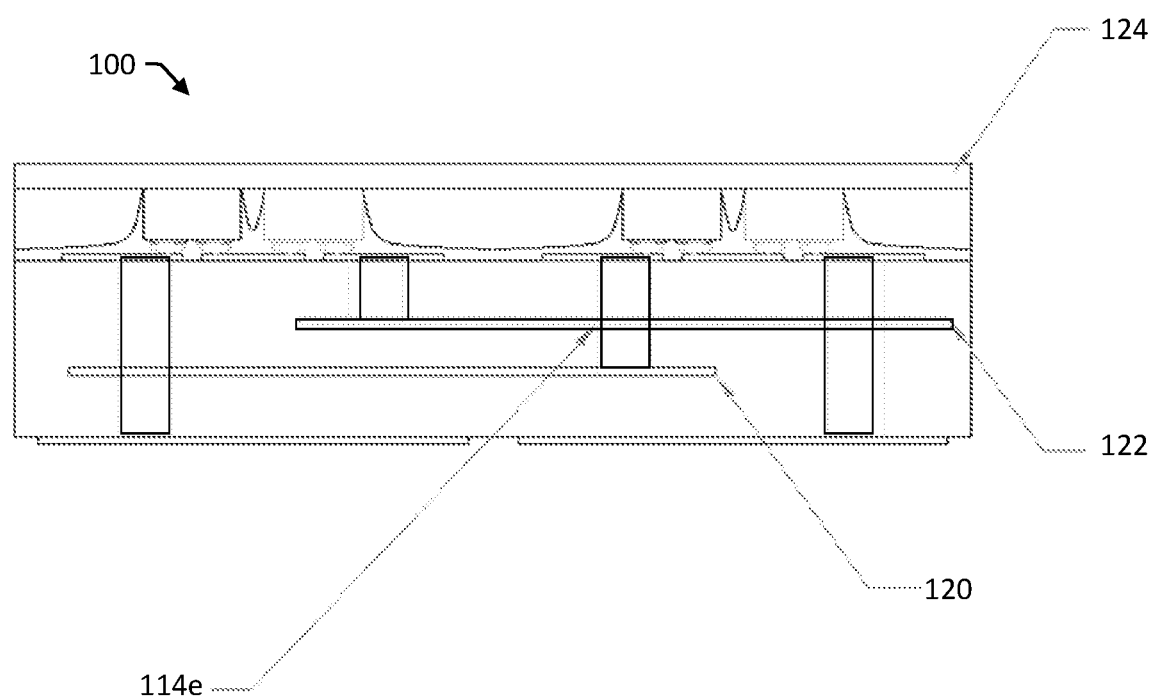
Figure 1J:
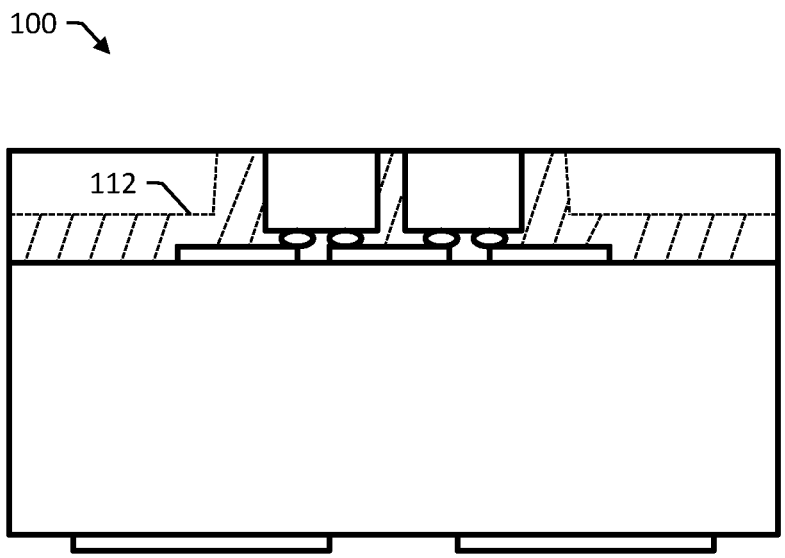

FIG. 1I is a side view of apparatus 100 where the substrate is an optional multilayer substrate. The substrate includes inner trace layers 120 and 122. Via 114*e* can bypass inner trace layer 122 to electrically couple to inner trace layer 120. Using inner trace layers can be useful, e.g., for signal routing, particularly with multi-pixel arrays. Various via technologies such as plated through-hole, buried, blind, and microvias can be used.

Figure 1K:
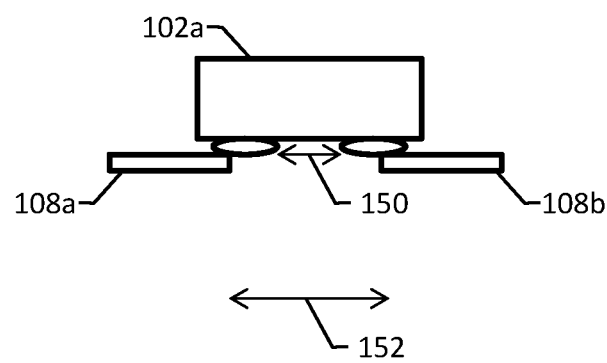

FIG. 1K is a diagram illustrating example relative distances between LED chip 102*a* and traces 108*a-b*. The distance 150 between the pads on LED chip 102 can be, e.g., between 40-60 µm. The distance between the traces (in a panel, the panel trace gap) can be about or less than 70 µm. In some examples, the distance 152 between the traces is larger than the distance 150 between the pads on LED chip 102*a*.

Figure 1L:
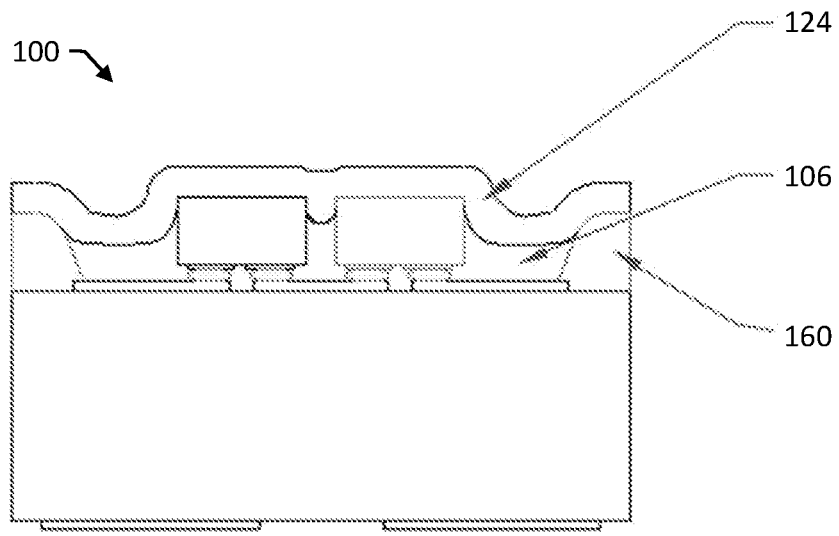
Figure 1M:
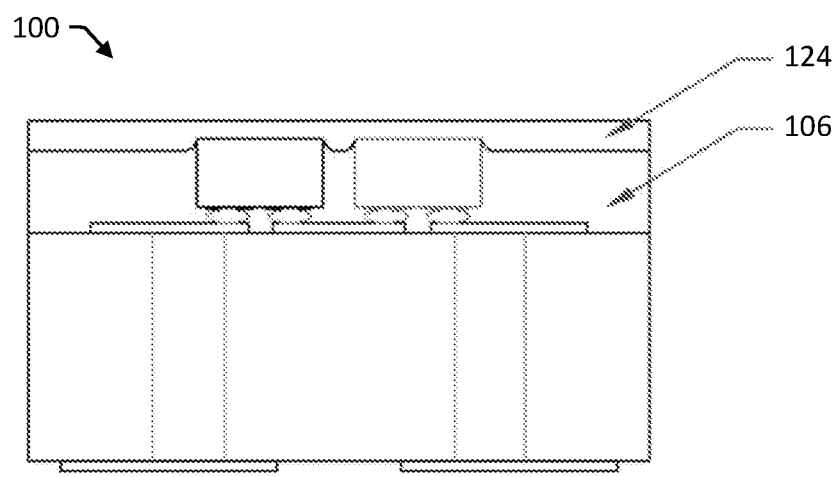

FIG. 1L illustrates apparatus 100 with a sidewall 160. Apparatus 100 includes an optional coating 124 and an encapsulation layer 106 that can be, e.g., white, dark or black, clear, or any appropriate color. Sidewall 160 can be any appropriate color and is typically white or black. In some examples, sidewall 160 is formed as a solder mask layer. FIG. 1M illustrates apparatus 100 with an optional coating 124 and an encapsulation layer 106. Encapsulation layer 106 can be any appropriate color, e.g., white or dark or black. Encapsulation layer 106 is not flush with the tops of the LED chips. This may happen when the removal of the encapsulation is faster than the chips, which can naturally result in encapsulation layer 106 being lower than the chip surfaces.

The back side of the LED chips depicted in any of the figures (the top side when viewing FIGS. 1A-M) can be roughened at the water level. Roughening the back side of the LED chips can make the addition of an additional matte finish layer unnecessary. For example, roughening a side, such as the back side, of the LED chips can reduce or eliminate the specular reflection of the LED chips.

Figure 1N:
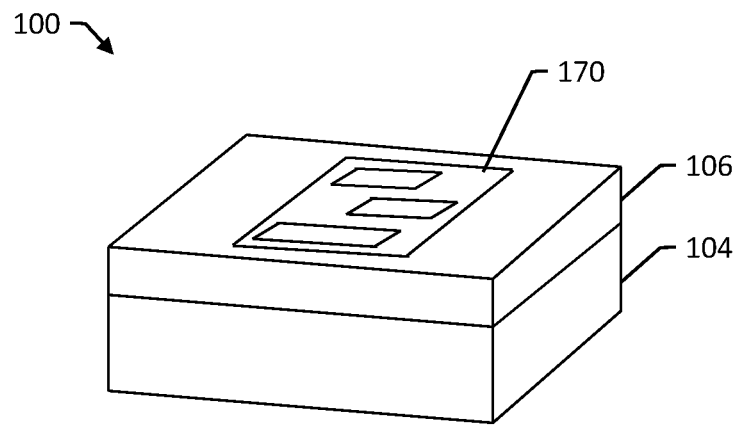

FIG. 1N illustrates apparatus 100 with a white encapsulation layer 170 that is in contact with the LED chips and a dark or black encapsulation layer 106. The white encapsulation layer 170 surrounds the LED chips and is between the LED chips. The black encapsulation layer 170 surrounds both the LED chips and the white encapsulation layer 170. The black encapsulation layer 106 is near to the LED chips even though it may not be in contact with the LED chips. For example and without limitation, the smallest distance between any portion of the black encapsulation layer 106 and any of the LED chips may be less than a threshold distance of 200 μm or less, 150 μm or less, 100 μm or less, or 50 μm or less.

Figure 1O:
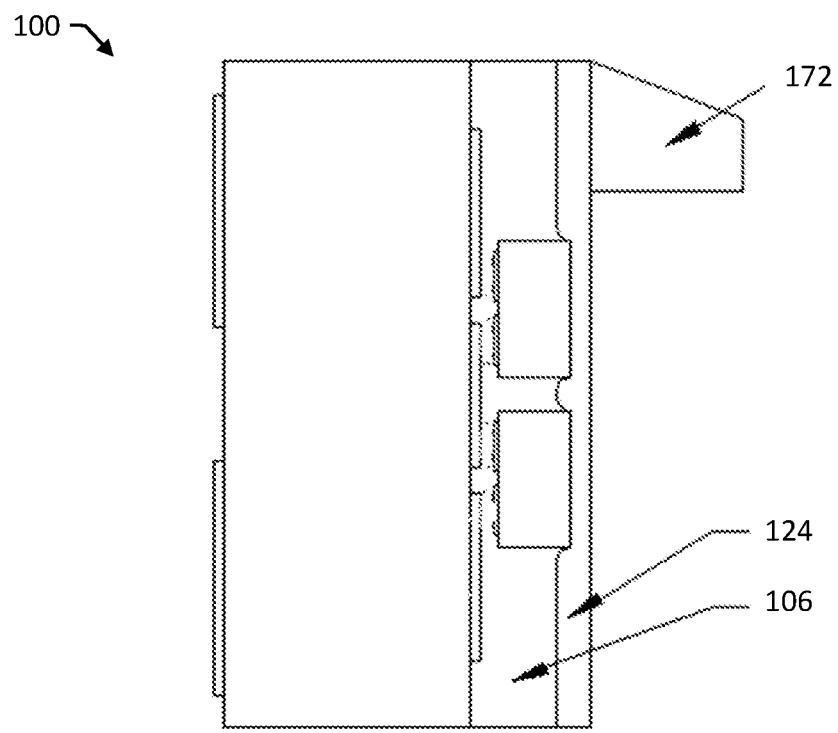

FIG. 1O illustrates apparatus 100 with an optional light blocking feature 172. In general, the light blocking feature 172 can protrude from or be disposed above a surface of apparatus 100, e.g., from a top-most optional layer 124. The light blocking feature 172 can be any appropriate shape for blocking light from a certain direction for the LED chips. For example, the light blocking feature 172 can be a rectangle or a rectangle with an edge opposite the LED chips that tapers away from apparatus 100, as illustrated in FIG. 1O. The light blocking feature 172, which can also be called a light blocking element or elements, can be made of any appropriate material and process. For example, epoxy or silicone can be molded or otherwise dispensed, e.g., as described with reference to layers 124 and 106. Solder mask material can be used. Light blocking feature 172 can be screen printed on, dispensed on, molded on, or rigid piece(s) can be assembled with a suitable adhesive. Solder mask material can have a screen print followed by a pattern exposure and develop.

Figure 2A:
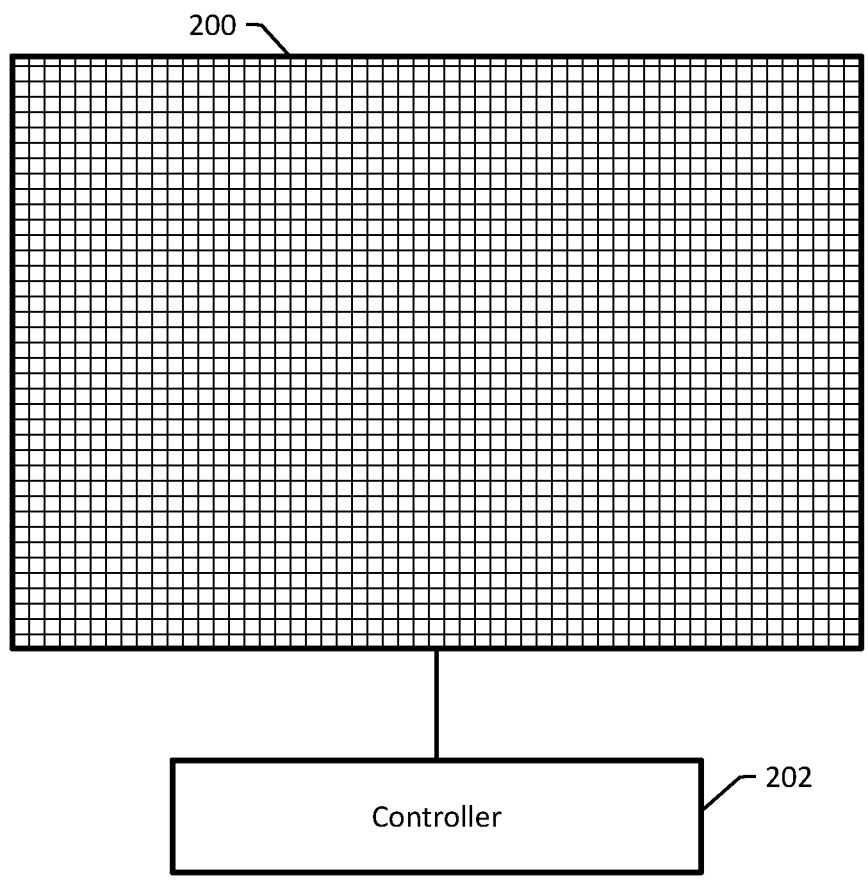
FIG. 2A is a diagram illustrating an example panel of LEDs.

FIG. 2A is a diagram illustrating an example panel 200 of LEDs. Panel 200 can be constructed using arrays of solid state lighting apparatuses such as those illustrated in FIGS. 1A-I as pixels. A controller 202 is configured to provide power to panel 200 and to control individual LEDs to display, e.g., pictures and video on panel 200.

By using apparatus 100 in panel 200, panel 200 can be made suitable for applications such as signs and indoor/outdoor panels. Using a matte dark or black finish for apparatus 100 allows for high contrast within panel 200 as apparatus 100 can reflect a relatively low amount of light. Opaque sidewalls around apparatus 100 can reduce cross-talk, so that light from one pixel does not leak into neighboring pixels. Since a louver/mesh light barrier can be avoided within panel 200, the overall pitch of panel 200 can be decreased relative to a panel having a louver/mesh light barrier. Panel 200 can have an improved viewing angle, e.g., as a result of placement of the LEDs chips within the encapsulation layer.

Panel 200 can be made using materials known not to degrade to improve reliability of panel 200 and to make panel 200 resistant to corrosion, which can be useful, e.g., for outdoor applications. Since panel 200 may be used in places where people may touch it, panel 200 can be made using robust soldering and robust panel assembly. For example, the soldering can use comparatively large pads with better adhesion to ceramic than FR-4, and panel assembly can be prepared with reduced damage to edge components when mating panels or sub-panels. Lack of wire bonds can also improve reliability.

Figure 2B:
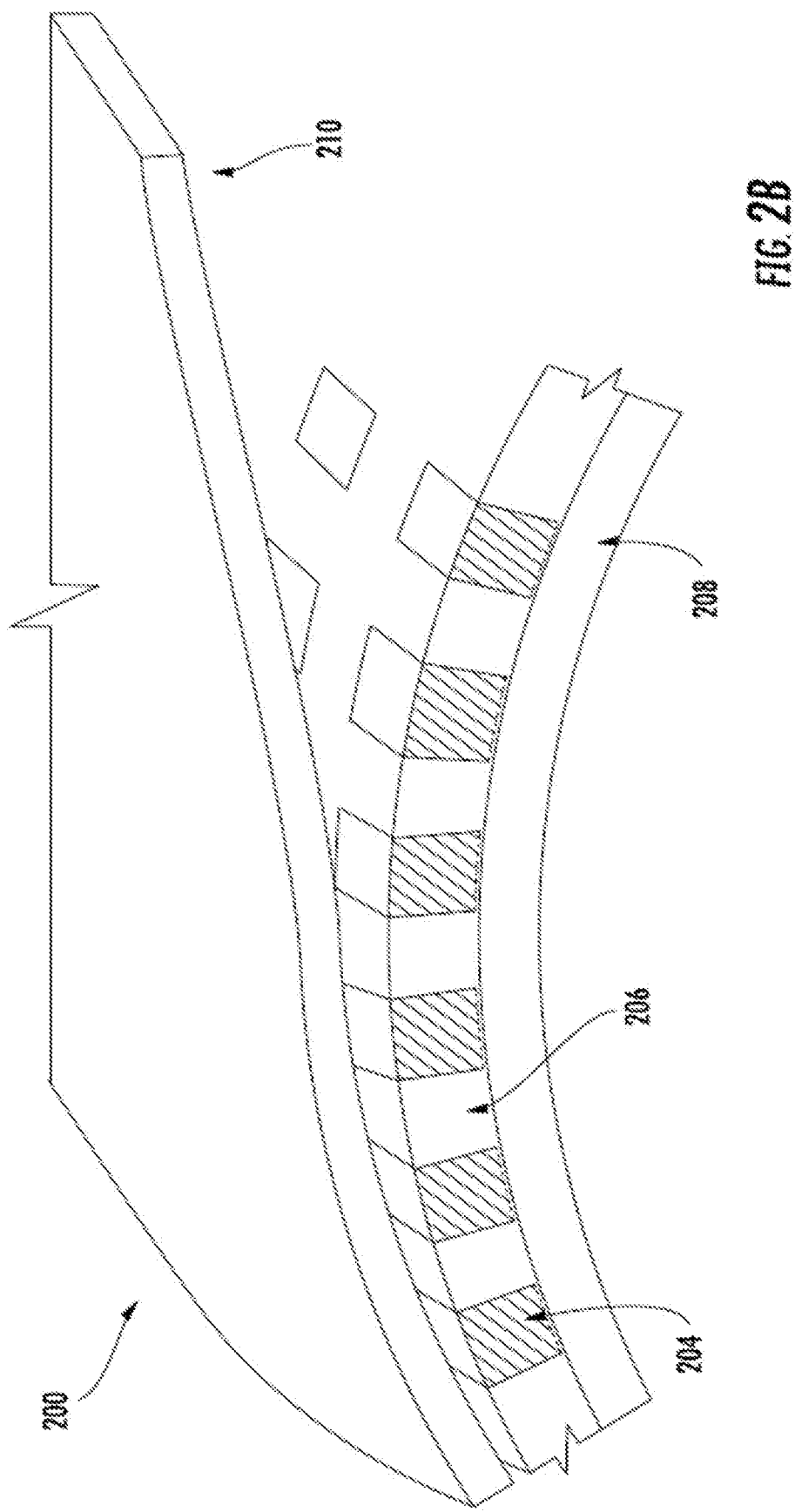
FIG. 2B is a cross-section side view of a portion of panel.

FIG. 2B is a cross-section side view of a portion of panel 200. Panel 200 includes Red Green Blue ("RGB") arrays 204, which can be made using arrays of solid state lighting apparatuses such as those illustrated in FIGS. 1A-I as pixels. The areas 206 between RGB arrays 204 can be filled, e.g., at a sub-panel assembly stage or during full panel assembly. RGB arrays 204 can be mounted on a layer 208 that can be, e.g., a motherboard or a sub-panel, which can be flat, or curved convex, concave, cylindrical, spherical, or other shapes. Panel 200 can include one or more sheets 210 of material added for, e.g., protection, anti glare, contrast, consistent look, filtering, light direction, 3D, parallax barrier, lenticular arrays, and so on. For example, sheets 210 can include a protective layer. The protective layer can have a matte finish for reducing specular reflection. The matte finish layer can be roughening on top sides of the LEDs or the black encapsulation layer or both. The protective layer can include optics layers. The protective layer can include diffractive elements. The protective layer can include liquid crystal elements or polarizing elements or both. The protective layer can include light blocking elements.

Panel 200 can be produced by applying electrically conductive bumps to the panel or the LED chips, joining the panel and the LED chips, and flooding the panel with encapsulation material so that the LED chips are surrounded by the encapsulation material. The electrically conductive bumps can be made from tin-silver-copper (SAC) on Ag. Applying the electrically conductive bumps can include using electroless plating or electrolytic plating. For example, the apparatus 100 illustrated in FIG. 1I can be extended to a larger array to be used in panel 200.

Figure 3:
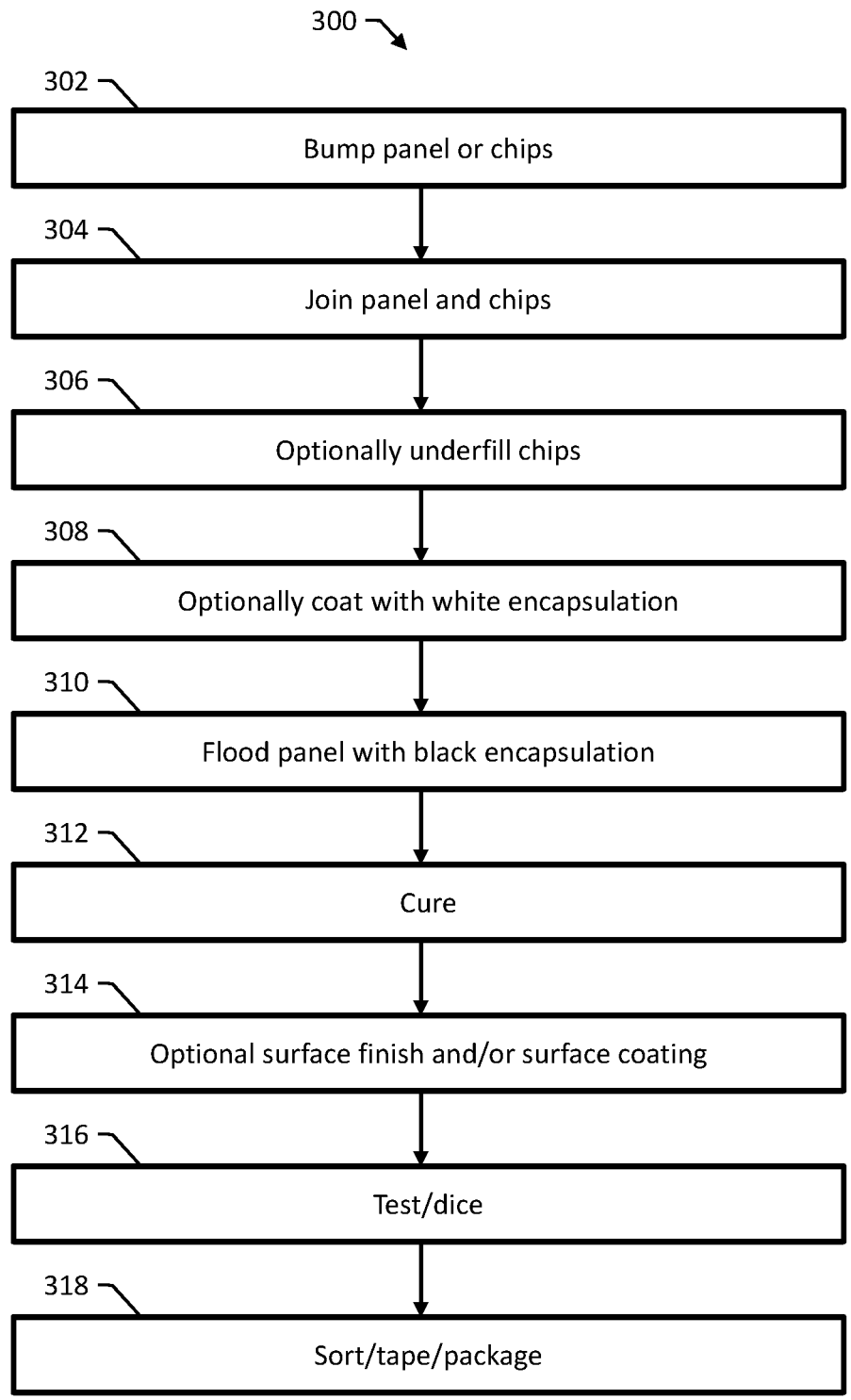
FIG. 3 is a flow diagram of an example process for fabricating a panel of LEDs.

FIG. 3 is a flow diagram of an example process 300 for fabricating a panel of LEDs, e.g., apparatus 100. In block 302, the panel or the LEDs chips are bumped, e.g., by adding bumps of solder or Au or any appropriate material. In this case, the panel can be an array of the substrate with traces, gaps, solder mask vias, and the like already formed. For example, the panel can come from a PCB manufacturer.

The solder can include eutectic metals. For example, AuSn or low cost die attach (LCDA) metals can applied to the pads of the LEDs; in some examples, tin-silver-copper (SAC) or other Pb free solder can be used, e.g., SAC 305. The pads on the LED chips can be a eutectic or non-eutectic solder. The shape of the pads on the LED chips can be, e.g., round, square, or other. The pads can be substantially flat. The LCDA can be a low temperature die attach metal, e.g., that melts at a temperature below 250° C. In block 304, the panel and the LED chips are joined, creating an electrical connection between the panel and the chips. The joint is established by providing energy (force, temperature, ultrasonic). In block 306, the chips are optionally underfilled, e.g., using any appropriate underfill material. The underfill material can be clear, white, or dark or black; white and black are both opaque and can block light leakage through the substrate. Mirrors made of metal or a dielectric can be used on the sides and/or the bottom of the chips to increase brightness with a low impact on contrast. In some examples, diffuse reflectors can be used on sides of the chips—e.g., using the same material as a white underfill, wetting up the sides of the chips.

In block 308, the surface is optionally coated with white encapsulation. In block 310, the panel is flooded with dark or black encapsulation. In some examples, the dark or black encapsulation layer can cover the LED chips, e.g., if the dark or black encapsulation layer is thin enough. In some examples, the LED chips are configured so that the dark or black encapsulation layer does not wet to the LED chips. For example, the LED chips can be configured using an adjustment to the surface tension of the LED chips, e.g., to have a high surface angle.

In block 312, the panel is cured. In block 314, an optional surface treatment or coating is performed, e.g., grinding, lapping, and the like. In block 316, the panel is tested, e.g., using any appropriate electrical testing equipment, and the panel is diced, e.g., into sub-panels or into full individual components. In block 318, the components are sorted, taped, and packaged. In some examples, the whole panel or individual sub-panels can be buffed and/or lapped and/or bead blasted to create a visually appealing finish lacking seams. The order of the process flow can be switched or otherwise reordered. For example, the components can be singulated before test.

Figure 4:
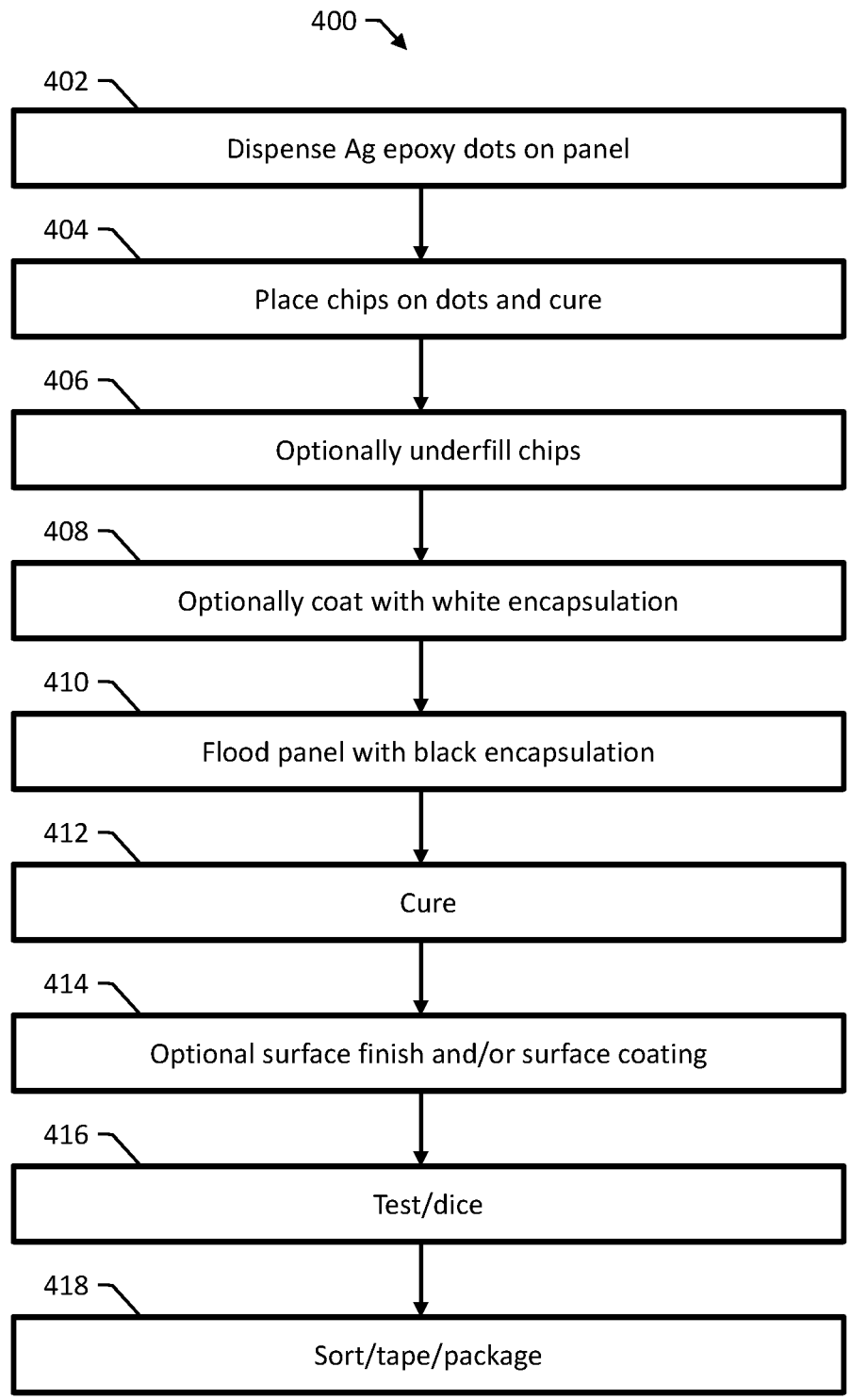
FIG. 4 is a flow diagram of an example process for fabricating a panel of LEDs.

FIG. 4 is a flow diagram of an example process 400 for fabricating a panel of LEDs, e.g., apparatus 100. In block 402, Ag epoxy dots are dispensed on the panel. In block 404, the LED chips are placed on the dots and the panel is cured to join the chips to the panel.

In some implementations, using Ag epoxy can result in smearing out. One solution is to use a solder mask with appropriate openings, e.g., as illustrated in FIG. 1H. The openings can be squeegeed over to dispense the Ag epoxy and place the chip. The openings can be made in various shapes and have paths cutout so that excess epoxy will be squeezed away from the chip when the chip is placed. The Ag epoxy can be dispensed in any appropriate manner, e.g., such as with jet printing. In that case, the desired spot may be overfilled, slightly, and the excess goes into a weeping path as the chip is placed. This can be useful, e.g., to keep the Ag epoxy dots from squeezing together and shorting the device. Larger particles can be added to the Ag epoxy dots, e.g., to help control the rheometry and thickness of the LED chips and/or the panel itself.

In block 406, the chips are optionally underfilled, e.g., using any appropriate underfill material. In block 408, the surface is optionally coated with white encapsulation. In block 410, the panel is flooded with dark or black encapsulation. In block 412, the panel is cured. In block 414, an optional surface treatment or coating is performed, e.g., grinding, lapping, and the like. In block 416, the panel is tested, e.g., using any appropriate electrical testing equipment, and the panel is diced, e.g., into sub-panels or into full individual panels. In block 418, the panel is sorted, taped, and packaged.

Figure 5A:
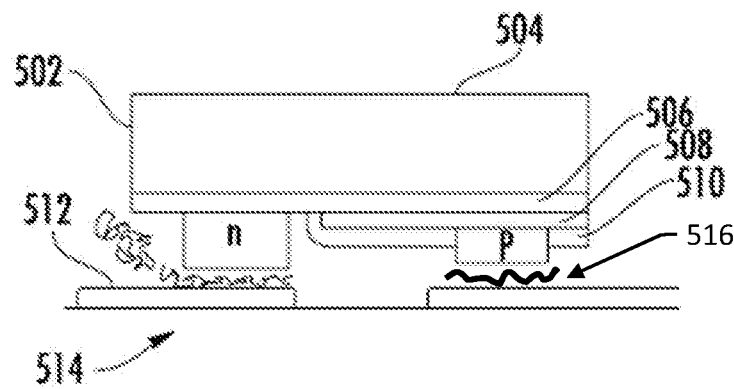
FIG. 5A is a diagram illustrating an LED chip 502 being attached using Ag epoxy.

FIG. 5A is a diagram illustrating an LED chip 502 being attached using Ag epoxy. The chip includes a substrate 504, e.g., made using sapphire, an n-type layer 506, a p-type layer 508, and a passivation layer 510. The contacts for LED chip 502 face conductive trace material 512 on a panel 514. Ag epoxy 516 is applied to the trace material 512, and then LED chip 502 is placed on the Ag epoxy 516. In some circumstances, the Ag epoxy may flow during the mounting process, resulting in a short between the p-type contact and the n-type layer 506, which can interfere with the operation of LED chip 502.

Figure 5B:
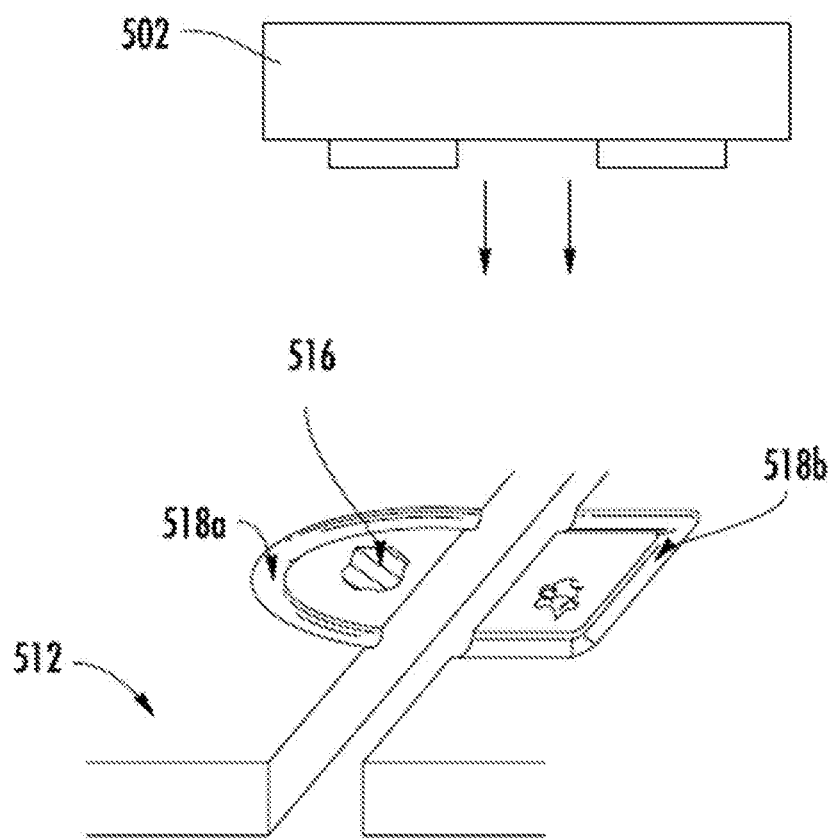
FIG. 5B is a perspective view of an LED chip 502 being attached using Ag epoxy to trace material 512 having trenches 518a-b in the trace material.
Figure 5C:
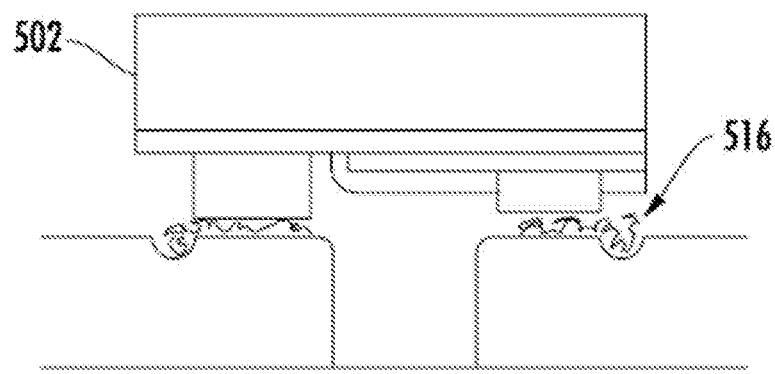
FIG. 5C is a side view of the LED chip 502 being attached.

FIG. 5B is a perspective view of an LED chip 502 being attached using Ag epoxy to trace material 512 having trenches 518a-b in the trace material. FIG. 5C is a side view of the LED chip 502 being attached.

By carving trenches 518a-b into trace material 512, the Ag epoxy 516 can flow into trenches 518a-b instead of upwards around LED chip 502, thereby preventing a short between the p-type contact and the n-type layer 506 or other types of short circuits. Trenches 518a-b can be any appropriate shape and depth for receiving an amount of Ag epoxy 516 to prevent short circuits.

Figure 5D:
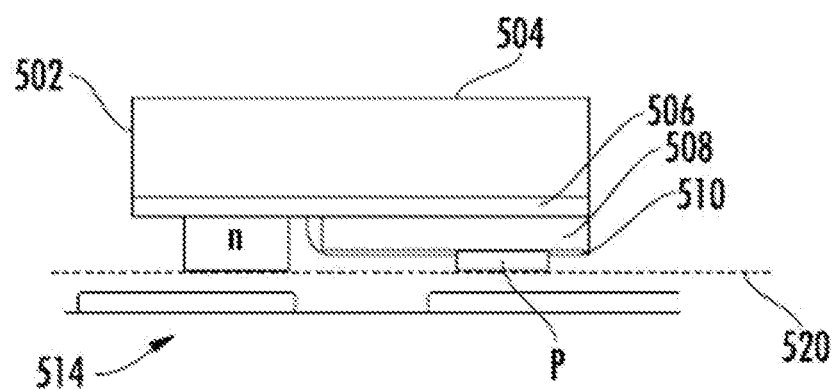
FIG. 5D is a diagram illustrating the n-pad and the p-pad and LED chip 502 as coplanar.

FIG. 5D is a diagram illustrating that the n-pad and the p-pad an LED chip 502 can be coplanar. The n-pad and the p-pad can be coplanar or substantially coplanar, i.e., so that the bottoms of both the n-pad and the p-pad extend to a same plane 520. The pads would be considered substantially coplanar if they would be exactly coplanar except for normal manufacturing variance, e.g., differences between the targeted and actual thicknesses of the individual n and p pads. In some examples, the term substantially coplanar includes a maximum variation of +/−25 μm. The average variation may be smaller, e.g., about 5 μm.

Direct attach chips can be made so that the pads are nearly coplanar, but they do not necessarily need to be made that way. For example, solder bumps can be used for attachment so that differences in the solder compensate for differences in the thicknesses of the n-pad and the p-pad while keeping LED chip 502 substantially level. In some examples, the polarity of LED chip 502 can be reversed from the polarity illustrated in FIG. 5D. As illustrated, LED chip 502 is a typical blue and green structure, but other examples such as red LED chips can have the n-pad on the mesa 508.

Figure 6:
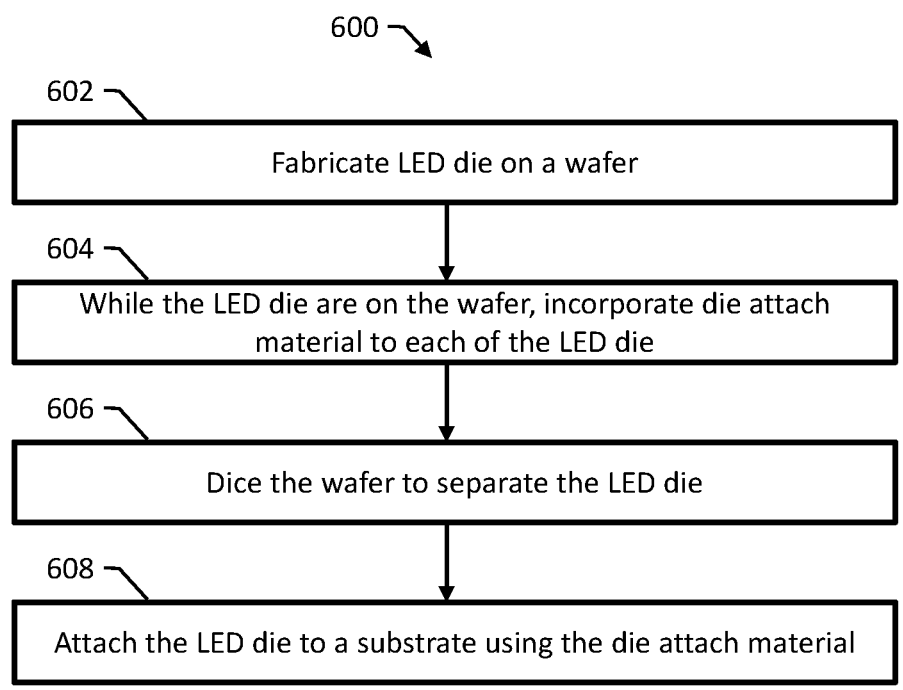
FIGS. 6 and 7 are flow diagrams of example methods for producing LED devices.

FIG. 6 is a flow diagram of an example method 600 for producing LED devices. A number of LED die are fabricated on a wafer using any appropriate LED fabrication technique (602). While the LED die are on the wafer, die attach material is incorporated to each of the LEDs (604). Incorporating the die attach material can include providing or forming AuSn bondpads on the LED die. In some examples, incorporating the die attach material includes forming bond pads as low cost die attach (LCDA) bond pads. Solder such as SAC305 can also be used for example.

The wafer is diced to separate the LED die (606). For example, the wafer can be diced using a wafer saw. The LED die are attached to at least one substrate, and possibly one substrate for each of the diced LED die, using the die attach material incorporated while the LED die were on the wafer (608). Attaching the LED die can include performing a flux-eutectic bonding process using AuSn or other solder-bumped bondpads.

Figure 7:
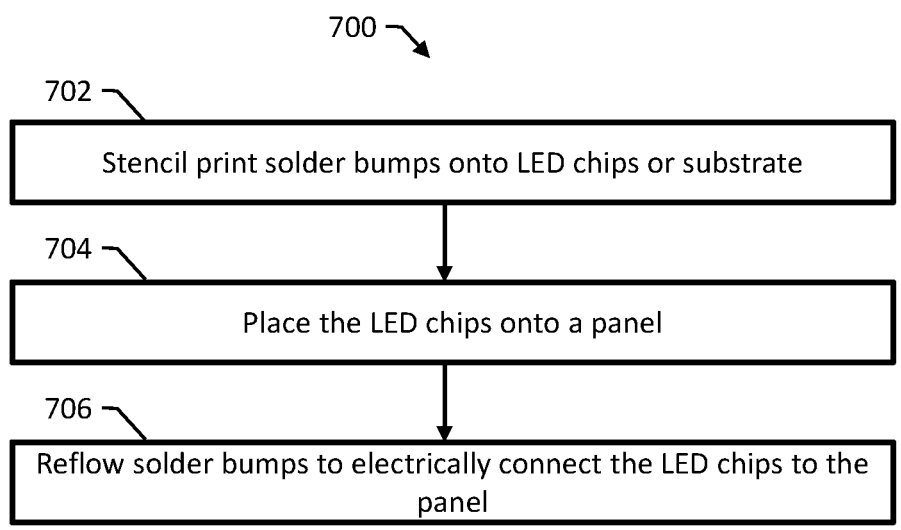

FIG. 7 is a flow diagram of an example method 700 for producing LED devices. Solder bumps are stencil printed onto LEDs or the substrate (702). The LED chips are placed onto a panel (704). For example, the LED chips can placed over electrical traces that run through the panel. The solder bumps are reflowed to electrically connect the LED chips to the panel (706).

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitting diode (LED) apparatus comprising:
a substrate;
a plurality of electrically conductive top traces on the substrate, the plurality of electrically conductive top traces being entirely external to the substrate;
one or more light emitting diodes (LEDs) each comprising a bottom surface, a top surface opposite the bottom surface, and side surfaces that are between the top surface and the bottom surface, wherein the bottom surface is mounted to the substrate such that the one or more LEDs are electrically coupled to the plurality of electrically conductive top traces;
a dark encapsulation layer that surrounds the side surfaces of the one or more LEDs, wherein the dark encapsulation layer is less than 200 μm away from each of the side surfaces of the one or more LEDs, and wherein the dark encapsulation layer is coplanar, or within 25 μm or less, with the top surface of the one or more LEDs;
a reflective layer on the side surfaces of the one or more LEDs such that the reflective layer is arranged between the side surfaces of the one or more LEDs and the dark encapsulation layer, the reflective layer extends on a surface of the substrate adjacent the one or more LEDs, and the reflective layer is between the bottom surface of the one or more LEDs and the substrate; and
an additional layer that laterally extends over the one or more LEDs and a top surface of the dark encapsulation layer, the additional layer comprising one of:
a matte finish for reducing specular reflection;
a plurality of optics layers;
one or more diffractive elements;
liquid crystal elements or polarizing elements or both;
a layer of phosphor or other light converting elements; and
a plurality of light blocking elements.

2. The apparatus of claim 1, further comprising a plurality of electrically conductive bottom traces disposed over the substrate, and wherein the electrically conductive bottom traces cover at least 45% of a bottom area of the substrate.

3. The apparatus of claim 1, wherein the one or more LEDs is electrically connected to at least two of the electrically conductive top traces using tin-silver-copper (SAC) solder.

4. The apparatus of claim 1, wherein the one or more LEDs is a plurality of LEDs, the dark encapsulation layer is disposed between adjacent LEDs of the plurality of LEDs, and the dark encapsulation layer is in direct contact with each LED of the plurality of LEDs.

5. The apparatus of claim 1, wherein the dark encapsulation layer comprises a silicone or an epoxy and is made dark by using pigments including carbon or iron oxide.

6. The apparatus of claim 1, wherein the substrate comprises a dielectric material and the plurality of electrically conductive top traces comprises metal traces on the substrate.

7. The apparatus of claim 1, wherein the one or more LEDs face outwards from a light-emitting side of the apparatus, and wherein the light-emitting side of the apparatus comprises a surface that is substantially dark.

8. The apparatus of claim 1, wherein the reflective layer comprises white encapsulation material.

9. The apparatus of claim 8, wherein the reflective layer is coplanar, or within 25 μm or less, with the top surface of the one or more LEDs.

10. The apparatus of claim 8, wherein the dark encapsulation layer and the reflective layer are coplanar with each other or within +/−25 μm of each other.

11. The apparatus of claim 1, comprising a diffuse top layer over the one or more LEDs or the dark encapsulation layer or both, resulting in a matte finish or a modified light emission pattern.

12. The apparatus of claim 1, wherein at least one LED of the one or more LEDs comprises at least two contacts on a same side of the at least one LED.

13. The apparatus of claim 1, wherein the reflective layer is further arranged between the dark encapsulation layer and the substrate.

14. The apparatus of claim 1, wherein the additional layer comprises the plurality of optics layers.

15. The apparatus of claim 1, wherein the additional layer comprises the matte finish for reducing specular reflection.

16. The apparatus of claim 15, wherein the matte finish comprises roughening on top surfaces of the LEDs or the dark encapsulation layer or both.

17. The apparatus of claim 15, wherein the matte finish is less than 50 μm thick.

18. The apparatus of claim 15, wherein the matte finish is formed using fumed silica.

19. The apparatus of claim 1, wherein the apparatus has a length or width or both that is less than or equal to 1 mm.

20. A light emitting diode (LED) apparatus comprising:
a substrate comprising a plurality of electrically conductive top traces;
at least one light emitting diode (LED) on the substrate such that the at least one LED is electrically coupled to the plurality of electrically conductive top traces, the LED comprising a light emitting surface;
a dark encapsulation layer with a top surface that is coplanar, or within 25 μm or less, with the light emitting surface of the LED; and
an additional layer that laterally extends over the LED and the dark encapsulation layer such that the additional layer laterally extends over the top surface of the dark encapsulation layer, the additional layer comprising at least one of:
a matte finish for reducing specular reflection;
a plurality of optics layers;
one or more diffractive elements;
liquid crystal elements or polarizing elements or both;
a layer of phosphor or other light converting elements; and
a plurality of light blocking elements.

21. The apparatus of claim 20, wherein the substrate comprises a top side opposite a bottom side, the bottom side having a plurality of electrical pads.

22. The apparatus of claim 21, comprising a plurality of electrically conductive bottom traces disposed over the substrate, wherein the plurality of electrically conductive bottom traces cover at least 45% of an area of the bottom side of substrate.

23. The apparatus of claim 20, wherein the at least one LED is electrically connected to at least two of the electrically conductive top traces using tin-silver-copper (SAC) solder.

24. The apparatus of claim 23, wherein the electrically conductive top traces comprise Ag plated traces.

25. The apparatus of claim 24, wherein the Ag plated traces comprise copper traces with immersion Ag or electrolytic Ag and an optional Ni barrier.

26. The apparatus of claim 20, wherein a height of the additional layer over the at least one LED or the dark encapsulation layer is less than or equal to 50 μm.

27. A panel comprising:
a sub-panel layer; and
a plurality of RGB component arrays on the sub-panel layer, each RGB component array comprising a plurality of components; and
wherein at least one component of the plurality of components comprises:
a substrate comprising a plurality of electrically conductive top traces;
one or more light emitting diodes (LEDs), each of which comprises a bottom surface, a top surface opposite the bottom surface, and side surfaces that are between the top surface and the bottom surface, wherein the bottom surface is mounted to the substrate such that the one or more LEDs are electrically coupled to the plurality of electrically conductive top traces;
a dark encapsulation layer surrounding the one or more LEDs wherein a top surface of the dark encapsulation layer is coplanar, or within 25 μm or less, with the top surface of the one or more LEDs;
a reflective layer on the side surfaces of the one or more LEDs such that the reflective layer is arranged between the side surfaces of the one or more LEDs and the dark encapsulation layer, the reflective layer extends on a surface of the substrate adjacent the one or more LEDs, and the reflective layer is between the bottom surface of the one or more LEDs and the substrate; and
an additional layer that laterally extends over the LED and the dark encapsulation layer such that the additional layer laterally extends over the top surface of the dark encapsulation layer, the additional layer comprising at least one of:
a matte finish for reducing specular reflection;
a plurality of optics layers;
one or more diffractive elements;
liquid crystal elements or polarizing elements or both;
a layer of phosphor or other light converting elements; and
a plurality of light blocking elements.

28. The panel of claim 27, wherein the additional layer comprises the matte finish for reducing specular reflection.

* * * * *